(12) United States Patent
Demizu et al.

(10) Patent No.: US 11,048,834 B2
(45) Date of Patent: Jun. 29, 2021

(54) INFORMATION PROCESSING APPARATUS, DESIGN SUPPORT METHOD, AND NON-TRANSITORY COMPUTER-READABLE RECORDING MEDIUM FOR RECORDING DESIGN SUPPORT PROGRAM

(71) Applicant: FUJITSU LIMITED, Kawasaki (JP)

(72) Inventors: Koji Demizu, Atsugi (JP); Hirooki Hayashi, Kawasaki (JP); Hidekatsu Sasaki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 703 days.

(21) Appl. No.: 15/888,146

(22) Filed: Feb. 5, 2018

(65) Prior Publication Data

US 2018/0276330 A1     Sep. 27, 2018

(30) Foreign Application Priority Data

Mar. 21, 2017   (JP) .............................. JP2017-054668

(51) Int. Cl.
*G06F 30/17*        (2020.01)
(52) U.S. Cl.
CPC ..................... *G06F 30/17* (2020.01)
(58) Field of Classification Search
CPC ....................................................... G06F 30/17
See application file for complete search history.

(56) References Cited

U.S. PATENT DOCUMENTS

| | | | |
|---|---|---|---|
| 2014/0303939 A1 | 10/2014 | Sekido et al. | |
| 2016/0275717 A1* | 9/2016 | Mizoguchi | A63F 13/5258 |
| 2017/0278300 A1* | 9/2017 | Hurter | G06T 15/40 |
| 2018/0342096 A1* | 11/2018 | Peterson | G06T 11/40 |

FOREIGN PATENT DOCUMENTS

| | | |
|---|---|---|
| JP | 11-272719 | 10/1999 |
| JP | 2003-330972 | 11/2003 |
| WO | 2013/058117 | 4/2013 |

OTHER PUBLICATIONS

Otaduy, M. A., & Lin, M. C. (Oct. 2001). User-centric viewpoint computation for haptic exploration and manipulation. In Proceedings Visualization, 2001. VIS'01. (pp. 311-567). IEEE. (Year: 2001).*

Tao, Y., Wang, Q., Chen, W., Wu, Y., & Lin, H. (Jun. 2016). Similarity voting based viewpoint selection for volumes. In Computer graphics forum (vol. 35, No. 3, pp. 391-400). (Year: 2016).*

* cited by examiner

*Primary Examiner* — Bijan Mapar

(74) *Attorney, Agent, or Firm* — Fujitsu Patent Center

(57) ABSTRACT

An information processing apparatus: calculates, for each part at a first time point, a first priority determination value for a first priority based on a first shortest distance between a first viewpoint and the parts and a first projection distance between a first screen center at the first time point and the parts; calculates, for each part at a second time point, a second priority determination value for a second priority based on a second shortest distance between the first viewpoint and the parts and a second projection distance between a second screen center at the second time point and the parts; calculates a third priority determination value by replacing the first view point with viewpoint candidates; selects a new first viewpoint among the first viewpoint and the viewpoint candidates; and reproduces an image of the parts at the first time point as viewed from the new viewpoint.

12 Claims, 35 Drawing Sheets

FIG. 7

| PART ID | VERTEX ID | VERTEX COORDINATES |
|---|---|---|
| | | |
| A | point1 | 0,0,0 |
| | point2 | 1,0,0 |
| | point3 | 1,1,0 |
| | point4 | 0,1,0 |
| | point5 | 2,0,0 |
| | ... | ... |
| | FACE ID | VERTEX ID |
| | | |
| | face1 | 1,2,3,4 |
| | face2 | 2,5,6,3 |
| | ... | |

| DEFECT ID | DETAILS OF DEFECT | VIEWPOINT REPRODUCTION INFORMATION ID |
|---|---|---|
| 1d3x | INSUFFICIENT STRENGTH AROUND BUTTON HOLE OF UPPER COVER | Viewinfo001 |
| ... | ... | ... |

FIG. 9

| VIEWPOINT REPRODUCTION INFORMATION ID | FIELD-OF-VIEW INFORMATION | VISIBLE ID | INVISIBLE PART ID | TRANSLUCENT PART ID | IMAGE ID |
|---|---|---|---|---|---|
| viewinfo001 | View001 | Visible001 | C | - | Image001 |
| ... | ... | | | ... | |

| FIELD-OF-VIEW INFORMATION ID | VIEWPOINT POSITION | ROTATION ANGLE | VIEWING ANGLE | | LINE-OF-SIGHT DIRECTION | POSITION OF INTERSECTION POINT (POINT OF INTEREST) | INTERSECTION PART ID |
|---|---|---|---|---|---|---|---|
| | $X_c, Y_c, Z_c$ | $X\theta, Y\theta, Z\theta$ | HORIZON | VERTICAL | | | |
| View001 | 142.62,60.53,3.1 | 15,0,180 | 43.6 | 43.6 | Y | 150,1,17 | PART A |
| ⋮ | ⋮ | ⋮ | ⋮ | ⋮ | ⋮ | ⋮ | ⋮ |

| DISPLAY ID | PART ID | VISIBLE/ INVISIBLE | SHORTEST DISTANCE | PROJECTION DISTANCE | POINT OF MEASUREMENT | | |
|---|---|---|---|---|---|---|---|
| | | | | | COORDINATES | FACE ID | VERTEX ID |
| Visible001 | A | VISIBLE | 52.95 | 4.36 | 154, 2.1, 15.0 | face1 | point1 |
| | B | VISIBLE | 53.03 | 4.03 | 146.6, 2.42, 18.83 | face5 | point80 |
| | D | INVISIBLE | 51.12 | - | 130.4, 1.0, 0 | face1 | point90 |
| ... | ... | ... | ... | ... | ... | ... | ... |

FIG. 24

| PART | REPRODUCTION SOURCE MODEL ||| PRIORITY |
| | SHORTEST DISTANCE L1 | PROJECTION DISTANCE L2 | PRIORITY DETERMINATION VALUE L1xL2^2 | |
| --- | --- | --- | --- | --- |
| A | 10 | 10 | 1000 | 1 |
| B | 10 | 15 | 2250 | 2 |

FIG. 25

| PART | REPRODUCTION DESTINATION MODEL | | | PRIORITY |
|---|---|---|---|---|
| | SHORTEST DISTANCE L1 | PROJECTION DISTANCE L2 | PRIORITY DETERMINATION VALUE L1xL2^2 | |
| A | 13 | 11 | 1573 | 2 |
| B | 7 | 5 | 175 | 1 |
| C | 18 | 9 | 1458 | - |
| D | 40 | 15 | 9000 | - |

FIG. 26

| PART | REPRODUCTION SOURCE POINT-OF-MEASUREMENT POSITION | REPRODUCTION DESTINATION POINT-OF-MEASUREMENT POSITION | OFFSET |
|---|---|---|---|
| A | 154, 2.1, 15 | 156, 2.1, 15 | 2, 0, 0 |
| B | 146.6, 4.2, 18.83 | 145.6, 4.2, 18.83 | -1, 0, 0 |

MIDPOINT BETWEEN OFFSETS (0.5, 0, 0)

FIG. 27

|  | VIEWPOINT POSITION |
|---|---|
| ORIGINAL VIEWPOINT | 142.62, 60.53, 3.1 |
| OFFSET VIEWPOINT WITH REFERENCE TO A | 142.62, 60.53, 3.1 |
| OFFSET VIEWPOINT WITH REFERENCE TO B | 142.62, 60.53, 3.1 |
| VIEWPOINT AT OFFSET MIDPOINT | 143.12, 60.53, 3.1 |

INFORMATION PROCESSING APPARATUS, DESIGN SUPPORT METHOD, AND NON-TRANSITORY COMPUTER-READABLE RECORDING MEDIUM FOR RECORDING DESIGN SUPPORT PROGRAM

CROSS-REFERENCE TO RELATED APPLICATION

This application is based upon and claims the benefit of priority of the prior Japanese Patent Application No. 2017-054668, filed on Mar. 21, 2017, the entire contents of which are incorporated herein by reference.

FIELD

The embodiment discussed herein is related to a design support program, an information processing apparatus, a design support method, and a non-transitory computer-readable recording medium for recording a design support program.

BACKGROUND

When developing new model products, such as various terminal devices, it is desirable that the designer reference the information about a defect found in the past and the information (for example, a checklist) about a portion pointed out by, for example, other designers in the past and check and test the state of the portion of interest (a part of interest).

At this time, in order to make use of the accumulated information about defects found in the product development phase or in the market in the past for each of products (the information about the past state of a part of interest), the information may be reproduced and displayed for a part of interest in the screen of a display unit that displays the most recent status of a product currently being developed.

Related technologies are disclosed in Japanese Laid-open Patent Publication No. 2003-330972, Japanese Laid-open Patent Publication No. 11-272719, or International Publication Pamphlet No. WO 2013/058117.

SUMMARY

According to an aspect of the embodiments, an information processing apparatus includes: a processor; and a memory configured to store a design support program executed by the processor, wherein the processor: calculates, for each of a plurality of parts at a first time point during a design, a first priority determination value for a first priority to display each of the parts at the first time point based on a first shortest distance between a first viewpoint and the respective parts and a first projection distance between a first screen center of a first display screen that displays a state of the respective parts as viewed from the first viewpoint at the first time point and the respective parts; calculates, for each of the parts at a second time point after the first time point, a second priority determination value for a second priority to display the respective parts at the second time point based on a second shortest distance between the first viewpoint and the respective parts and a second projection distance between a second screen center of a second display screen that displays a state of the respective parts as viewed from the first viewpoint at the second time point and the respective parts; calculates, when the first priority based on the first priority determination value differs from the second priority based on the second priority determination value, a third priority determination value corresponding to the second priority determination value by replacing the first viewpoint with each of one or more viewpoint candidates other than the first viewpoint; selects, as a new first viewpoint, a second viewpoint from among the first viewpoint and the one or more viewpoint candidates based on the third priority determination value; reproduces an image of the respective parts at the first time point as viewed from the new viewpoint; and displays the image on a display circuit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 7 illustrates an example of the details of recorded part information illustrated in FIG. 4;

FIG. 8 illustrates an example of the details of recorded defect information illustrated in FIG. 4;

FIG. 9 illustrates an example of the details of recorded viewpoint reproduction information illustrated in FIG. 4;

FIG. 10 illustrates an example of the details of recorded field-of-view information associated with the viewpoint reproduction information illustrated in FIG. 9;

FIG. 11 illustrates an example of the details of recorded measurement information associated with the viewpoint reproduction information illustrated in FIG. 9;

FIG. 24 illustrates an example of a first priority determination value and a first priority of the reproduction source model part;

FIG. 25 illustrates an example of a second priority determination value and a second priority of the reproduction destination model part;

FIG. 26 illustrates an example of offset values between a reproduction source model part and a reproduction destination model part;

FIG. 27 illustrates an example of the positions of the candidates for a new viewpoint;

DESCRIPTION OF EMBODIMENT

For example, the visibility state of a defective portion (the past state of the part of interest) is reproduced, but the current state may have changed from the state at the time of recording the defective portion.

For example, in some cases, in accordance with the progress of the design of the product after the recording of the defective portion, the portion that was visible at the time of recording the defective portion is hidden and becomes invisible due to a newly added part or the part whose position has been changed.

Therefore, at the viewpoint position at which the defective portion was recorded or in the visibility state in which the defective portion was recorded, the portion to be displayed (for example, a part of interest) may not be displayed and, thus, the designer, for example, may be unable to check the part of interest.

For example, when the visibility state of a defective portion is reproduced, the current state may have changed from the state at the time of recording the defective portion. For example, with the progress of product design after the recording of the defective portion, a part that was visible at the time of recording the defective part may be hidden and becomes invisible by a newly added part or an existing part whose position has been changed. Therefore, at the viewpoint position at which the defective portion was recorded or in the visibility state in which the defective portion was recorded, the portion to be displayed (for example, a part of interest) may not be displayed and, thus, the designer, for example, may be unable to check the part of interest.

Figure 1:
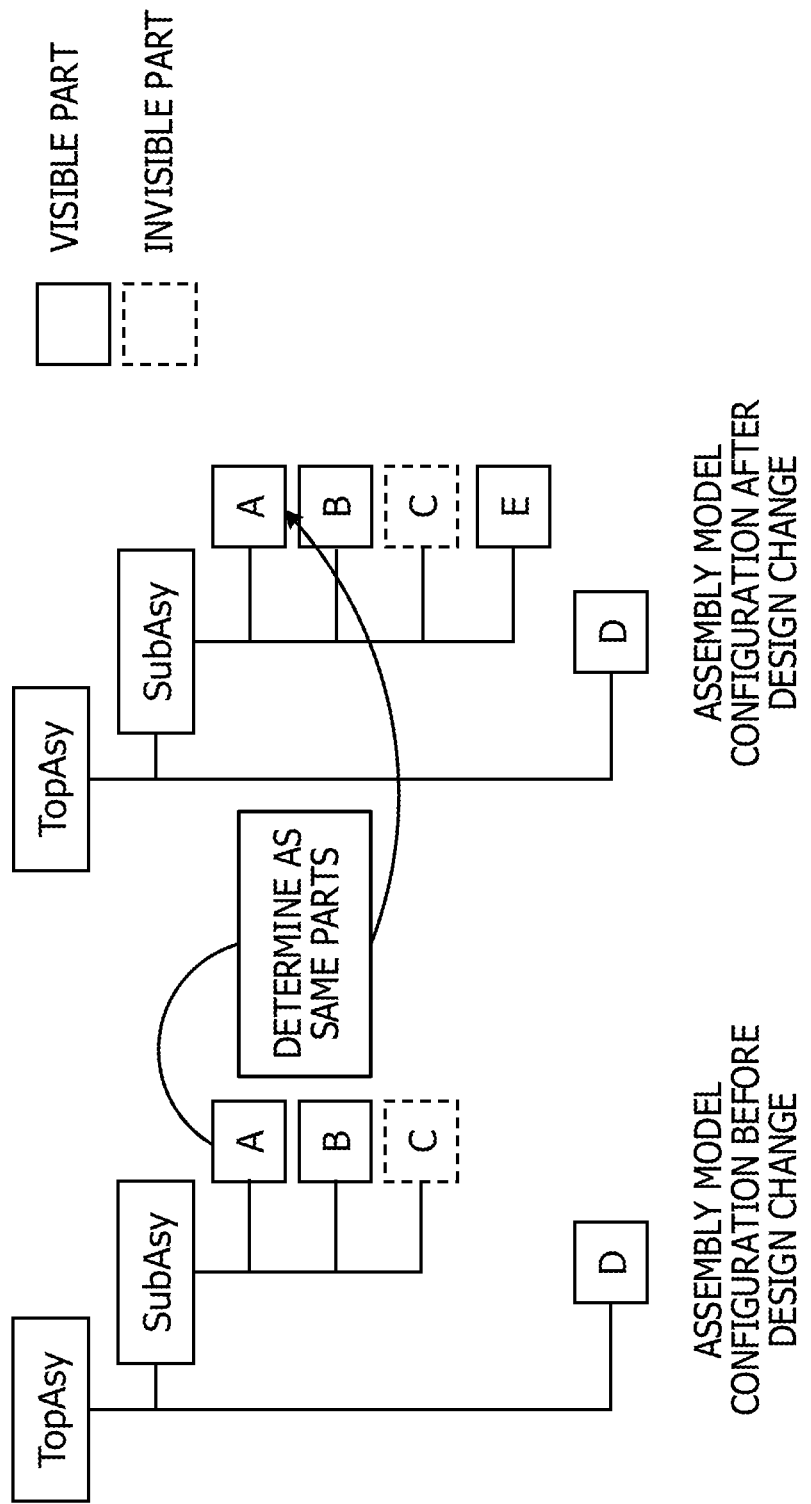
FIG. 1 illustrates an example of a correspondence relationship between the assembly model configurations before a design change and the assembly model configuration after the design change.

For example, as illustrated in FIG. 1, by using the assembly model configuration information (part IDs) before and after a design change, the same part is identified, or a newly added part is identified. FIG. 1 illustrates an example of a correspondence relationship between assembly model configurations before and after a design change.

As illustrated in FIG. 1, it is determined that parts having the same part ID "A" before and after a design change are determined as the same parts. In this manner, after identifying the same parts before and after a design change, the visible/invisible state of the specified part is reproduced. Hereinafter, a part having the part ID "A" is referred to as a "part A".

It is determined that a part E that does not exist before a design change and exists after the design change is a newly added part. However, because the visible/invisible mode is not set for the newly added part, the added part blocks the line of sight. For example, when the state illustrated in FIG. 2A (before a design change) is changed to the state illustrated in FIG. 2B, that is, the state where the part E is added, the line of sight from the viewpoint before the design change is blocked by the part E and, thus, a part B (a part of interest) becomes invisible from the viewpoint.

Figure 2A:
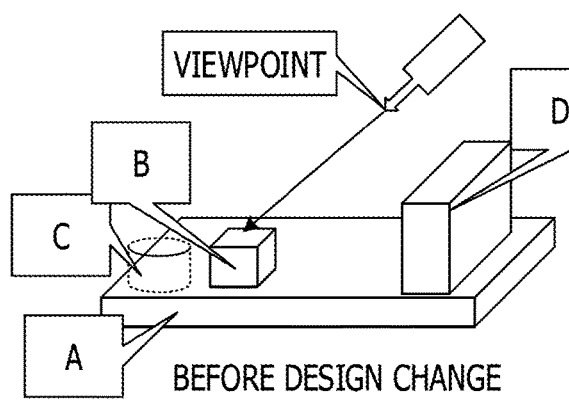
FIGS. 2A to 2C illustrate an example in which a part of interest which was visible in the display screen before a design change becomes invisible after the design change.
Figure 2B:
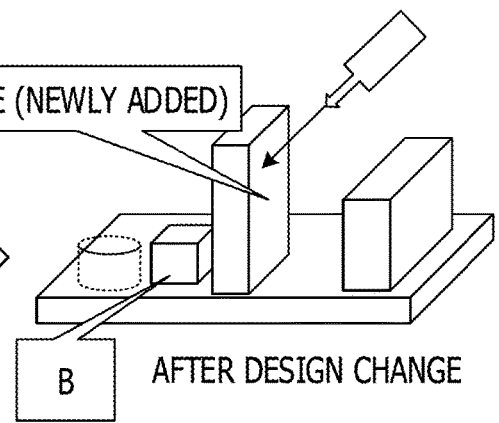
Figure 2C:
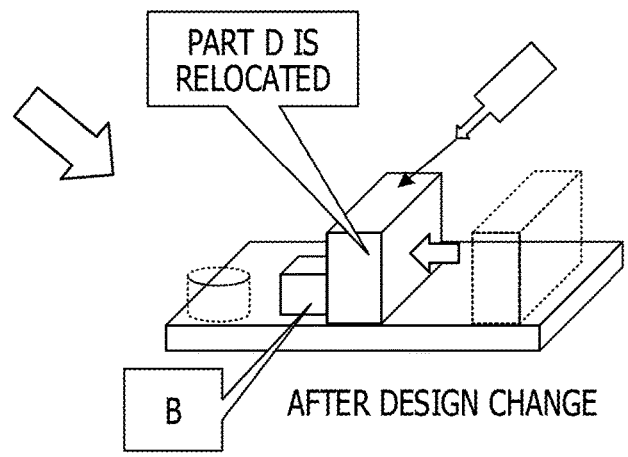

In addition, when the state illustrated in FIG. 2A (before a design change) is changed to the state illustrated in FIG. 2C, for example, the state in which a part D has been relocated, the line of sight from the viewpoint before a design change is blocked by the part D and, thus, the part B (the part of interest) becomes invisible from the viewpoint before the design change. FIGS. 2A to 2C illustrate an example in which a part of interest which was visible in the display screen before a design change becomes invisible after the design change.

As described above, by simply indicating the same parts before and after a design change, the visible/invisible state of each of the parts may not be reproduced.

In order to reproduce the visibility state of a defective portion during the checking work of many portions (for example, defective portions) and reuse it, the viewpoint position is to be recorded together with information as to "what is looked at and which portion is being checked" (for example, the name of viewpoint is input). However, this operation is very cumbersome and, thus, may not be performed.

An information processing apparatus (for example, a computer) identifies a part of interest (a portion of interest) based on the viewpoint position and the visibility state that are frequently used. Thereafter, the information processing apparatus automatically reproduces the viewpoint position and the visibility state in accordance with a change (for example, a change in the position or the shape of the part of interest or addition of a part in the vicinity of the part of interest) (refer to FIGS. 32 and 33).

At this time, in order to identify the portion of interest, the viewpoint position and the visibility state may be determined by combining the visibility states around the portion of interest based on the viewpoint (the shortest distance) and the line of sight (the projection distance). Relocation of a part, a change in the shape of a part, or addition of a part, which occurs during the progress of design of the target model, may be processed by determining the priority of each of the parts to be displayed based on the shortest distance and the projection distance. The visibility state may be reproduced at a viewpoint close to that in the visibility state at the time of recording (the recording state) by changing the viewpoint position based on the point of measurement (the measure point) of each of the recorded parts (refer to FIGS.

32 and 33). The point of measurement (the measure point) of each of the parts corresponds to a point (the vertex) of the part when the shortest distance between the viewpoint and the part is calculated.

Figure 32:
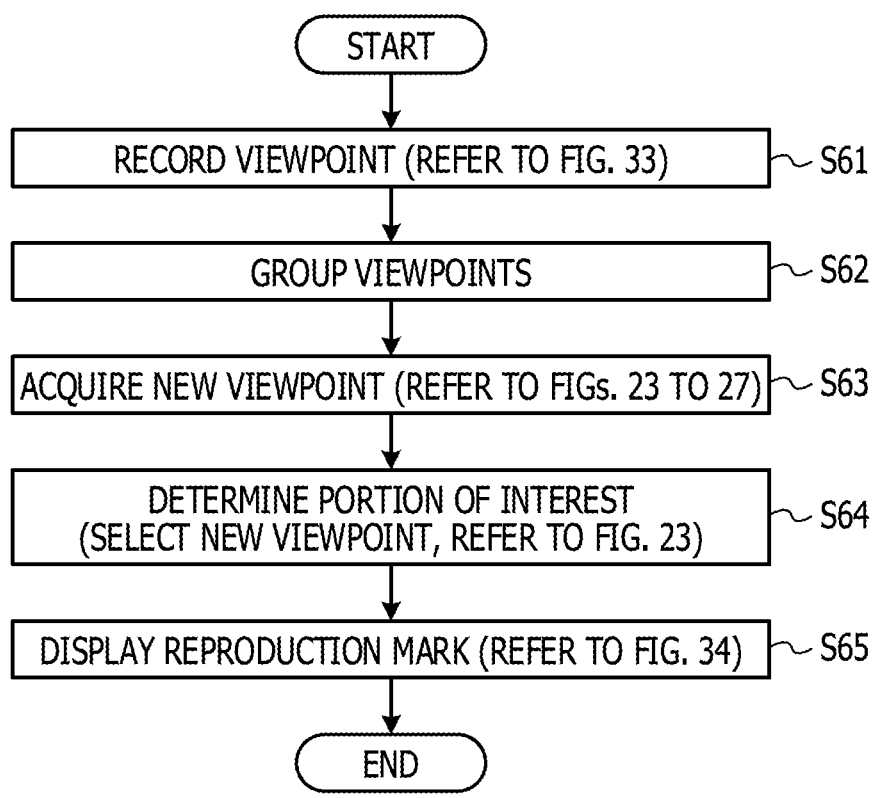
FIG. 32 illustrates an example of the procedure for automatic setting of a portion of interest.
Figure 33:
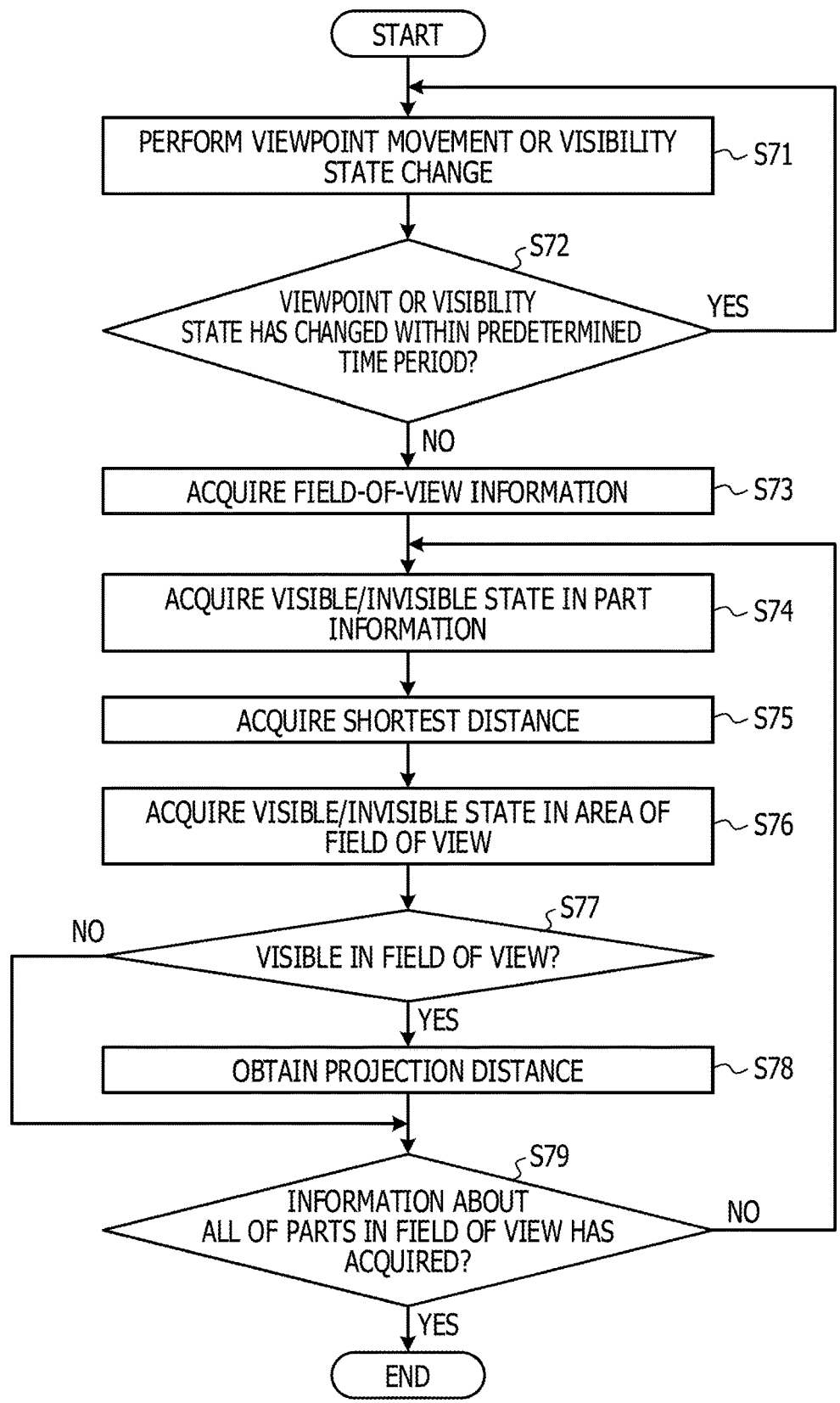
FIG. 33 illustrates an example of the process in operation S61 illustrated in FIG. 32.

At this time, without recording the visibility state by special equipment, the visibility state of the portion that are frequently referenced by, for example, the designer is automatically reproduced and displayed as the visibility state of the part of interest based on the operations usually performed on the screen by the designer (refer to FIG. 32 and FIG. 33). As a result, movement of the viewpoint for the portion of interest and reproduction of the visibility state are easily performed, so that the reproduction and display are performed in accordance with the progress of design of the target model.

The information processing apparatus is an apparatus suitable for use in reproducing an example of the design of the structure of a portion whose defect was pointed out in the past, for example, reproducing the displayed image of a portion in which a defect occurred (the visibility state of a defective portion). Therefore, in order to reproduce and display the image of the defective portion in accordance with a change even when the parts that constitute a product and that are handled as a virtual three-dimensional assembly model are changed due to a design change, the information processing apparatus has the functions (11) to (14) described below (refer to FIGS. 12 to 27).

(11) Reproduction Information Recording Function (refer to FIG. 5, FIGS. 8 to 11, and FIGS. 13 to 19)

The function (11) automatically records defect information 22 and viewpoint reproduction information 23 at the time of occurrence of a defect or when display of the image from a certain viewpoint satisfies a predetermined condition (for example, display of the image continues for a predetermined time period or longer). The information includes the shortest distance between the viewpoint and the part, the projection distance between the screen center of the viewpoint image and each of the parts, the viewpoint image, and the display portion of the annotation/dimension related to, for example, the defective portion. The viewpoint image is an image (the visibility state) that is seen when viewed in the predetermined line-of-sight direction from the viewpoint. The viewpoint image is also referred to as a "view field image".

(12) Visibility State Reproduction Function (refer to FIGS. 5, 21 to 27)

The function (12) reproduces the visibility of the part which matches the part at the time of recording by the function (11). In addition, for the part which does not match the part at the time of recording by the function (11) or the part which matches the part at the time of recording by the function (11) and, however, was relocated so as to hide another part visible at the time of recording, the function (12) determines a priority of visibility based on the shortest distance and the projection distance at the time of recording. The function (11) records annotations and the dimensions based on the viewpoint and visibility state at the time of creation, and the function (12) reproduces and displays the recorded annotations and dimensions in accordance with the current state.

The function (12) changes the viewpoint position based on the difference (for example, offset) between the point of measurement of each of the parts at the time of recording by the function (11) and the current point of measurement of the part. At this time, the function (12) acquires at least one offset viewpoint as a candidate viewpoint based on the difference and selects one from among the viewpoint for the portion of interest at the time of recording and the at least one candidate viewpoint based on a priority determination value (for example, the priority) or the similarity of a feature amount. For example, the function (12) compares the viewpoints with one another in terms of the priority determination value or the viewpoint images and selects a viewpoint with a low priority determination value (for example, a high priority) or a viewpoint with a high similarity as a new viewpoint for the portion of interest. In comparison of the viewpoint images, the viewpoint images may be directly compared with each other, or the similarities of the feature amount of the viewpoint images obtained by machine learning may be compared with each other.

Figure 5:
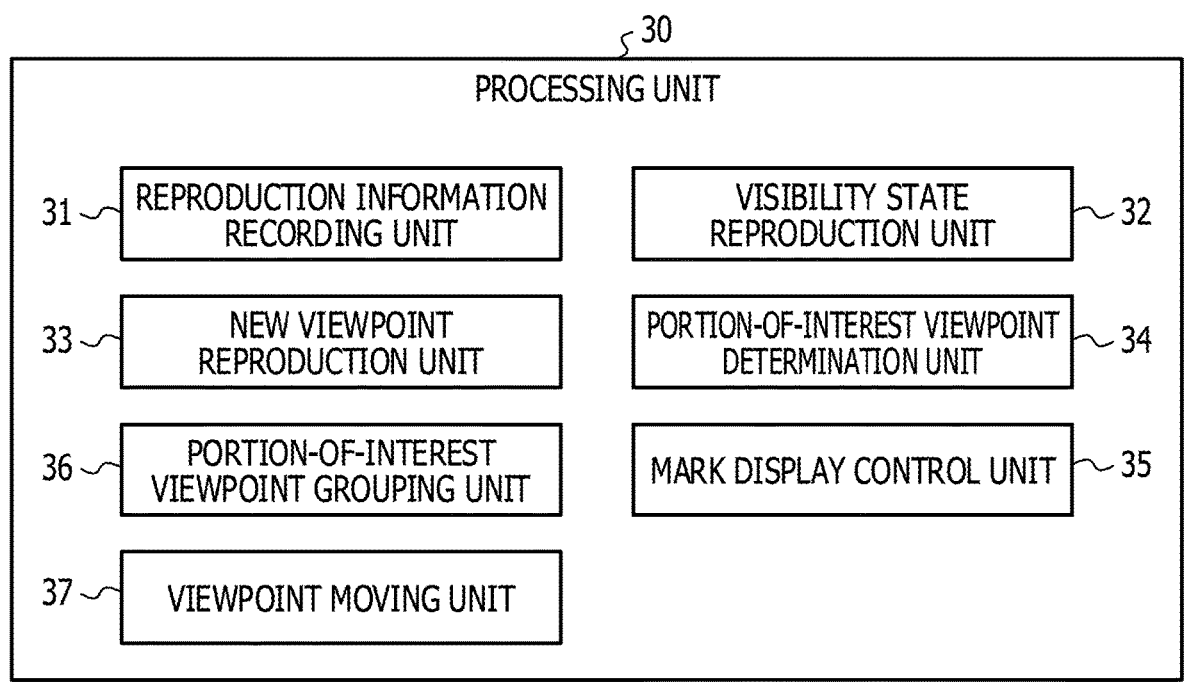
FIG. 5 illustrates an example of the functional configuration of a processing unit illustrated in FIG. 3.

(13) Automatic Viewpoint Recording Function (refer to FIGS. 5, 32, and 33)

If viewpoint movement or a change in the visibility state is not performed for several seconds (a predetermined time period) after a viewpoint movement, the function (13) automatically records the reproduction information for the viewpoint and the viewpoint image at that time. Among the plurality of recorded viewpoints, the function (13) groups the viewpoints for which the points of interest are physically close to one another. Like the function (12), the function (13) selects, from among the plurality of viewpoints in the same group, the one (corresponding to a new viewpoint in the function (12)) as a representative point of the viewpoints. The point of interest is the intersection point of the line of sight from the viewpoint and the part face (the face of the part of interest which is the portion of interest). As the same group, the group including the largest number of viewpoints may be selected.

(14) Viewpoint Checking Function (refer to FIGS. 5, 6, 28 to 31, 34, and 35)

The function (14) displays, in the portion of interest, a reproduction mark associated with the portion of interest and the viewpoint position of the portion of interest by using an output unit (for example, a display unit). In addition, the function (14) reproduces the visibility/invisibility of the part through, for example, a hover operation performed over the reproduction mark by using an input unit (for example, a mouse) to display a viewpoint image. When the reproduction mark is selected through, for example, a click operation, the function (14) switches the visibility state on the display unit to the visibility state seen from the viewpoint for the portion of interest associated with the reproduction mark. The function (14) projects the reproduction marks onto the inclusive sphere and selects a reproduction mark (a projection viewpoint) close in distance to the current viewpoint through an operation using an arrow key. The function (14) moves the viewpoint of the viewpoint image to be displayed to the viewpoint associated with the selected reproduction mark and reproduces, on the display unit, the visibility state seen from the moved viewpoint. In this manner, a viewpoint is easily moved.

In a design phase, the state of the portion of interest changes due to a shape change or a layout change. In addition, the state of the portion of interest changes when checking a similar portion in another model product. Due to such a change, the portion of interest may be covered with a part. At this time, according to the information processing apparatus, by prioritizing the parts to be displayed based on the shortest distance and the projection distance at the time of recording, it is possible to reproduce and display the portion of interest so that the portion of interest is visible on the display unit in accordance with the change. In this manner, even when a design change is made, the reproduction and display are performed without hiding the part of interest.

According to the information processing apparatus, when a portion of interest moves, the point of measurement of the movement destination and the point of measurement of the movement source are compared with each other, and the viewpoint is moved to a position closer to the viewpoint at the time of recording. Thus, the portion related to the portion of interest is reproduced and displayed.

According to the information processing apparatus, it is possible to automatically record a portion that is seen and the visibility state based on the ordinary usage conditions and display the viewpoint and the visibility state which are frequently used as the recommended display candidate on the display unit. By performing a hover operation or the like over the reproduction mark by using the input unit, the viewpoint image associated with the reproduction mark is displayed in a simplified display manner or in a reduced display manner. In this way, the viewpoint image and the visibility state are previewed before switching the screen (the viewpoint) (refer to FIG. 31).

As described above, according to the information processing apparatus, by using the variety of functions (11) to (14) described above, it is possible to easily switch the viewpoint and the visibility state for the portion of interest and to reduce the time of various confirmation processing performed for a product to be designed.

Figure 3:
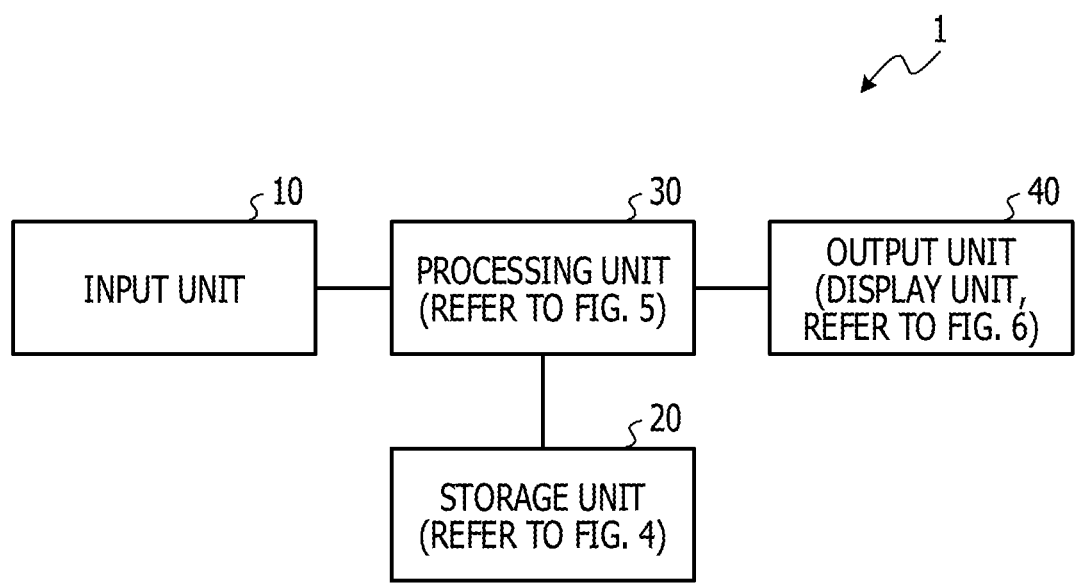
FIG. 3 illustrates an example of an information processing apparatus.

FIG. 3 illustrates an example of the information processing apparatus.

As illustrated in FIG. 3, the information processing apparatus 1 reproduces a viewpoint and a visibility state corresponding to a portion of interest, such as a defective portion. An example of the information processing apparatus 1 is a computer, such as a personal computer or a server computer. The information processing apparatus 1 includes an input unit 10, a storage unit 20, a processing unit 30, and an output unit 40. The input unit 10, the storage unit 20, the processing unit 30, and the output unit 40 are connected to one another so as to communicate with one another via a bus.

The input unit 10 is an input device for inputting various kinds of information. An example of the input unit 10 is an input device that receives input of operations, such as a mouse, a keyboard, a touch-sensitive panel, or an operation button. The input unit 10 receives various inputs. For example, the input unit 10 receives an operation input from a user, such as a designer, and inputs operation information indicating the received type of operation to the processing unit 30.

The storage unit 20 stores programs, such as an operating system (OS), firmware, and applications, and various data. A variety of storage devices may be used to serve as the storage unit 20. Examples of the storage unit 20 include a magnetic disk device, such as a hard disk drive (HDD), a semiconductor drive device, such as a solid state drive (SSD), and a nonvolatile memory. Examples of the nonvolatile memory include a flash memory, a storage class memory (SCM), and a read only memory (ROM). Furthermore, a volatile memory, such as a RAM (for example, a dynamic RAM (DRAM)), may be used as the storage unit 20. RAM stands for Random Access Memory. In the storage unit 20, programs that provide all or some of the variety of functions of the computer 1 may be stored.

Figure 4:
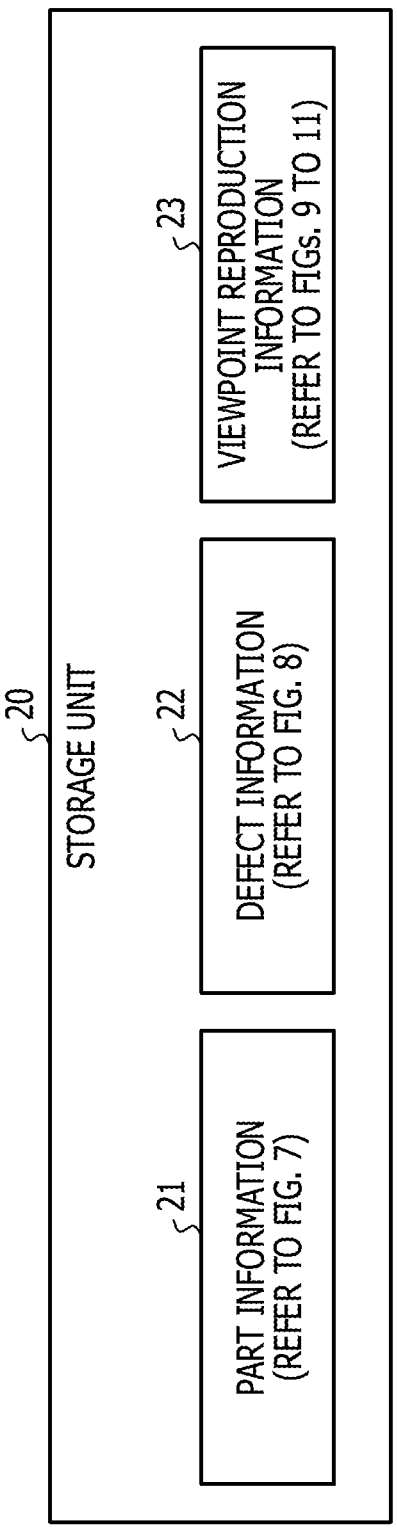
FIG. 4 illustrates an example of information stored in a storage unit illustrated in FIG. 3.

In the storage unit 20, a design support program that implements the variety of functions illustrated in FIG. 5 (refer to reference numerals 31 to 37) and that is executed by the processing unit 30 is stored. In addition, various information 21 to 23 illustrated in FIG. 4 are stored. FIG. 4 illustrates an example of the information stored in the storage unit 20 illustrated in FIG. 3. As illustrated in FIG. 4, the storage unit 20 stores part information 21, defect information 22, and viewpoint reproduction information 23. The viewpoint reproduction information 23 includes field-of-view information 231 and measurement information 232.

By executing the programs and the like in the storage unit 20, the processing unit 30 performs various control and calculation functions by using various data stored in the storage unit 20. An integrated circuit (IC), such as a CPU, a GPU, an MPU, a DSP, an ASIC, or a PLD (for example, FPGA), may be used as the processing unit 30. CPU stands for Central Processing Unit, GPU stands for Graphics Processing Unit, and MPU stands for Micro Processing Unit. DSP stands for Digital Signal Processor, and ASIC stands for Application Specific Integrated Circuit. PLD stands for Programmable Logic Device, FPGA stands for Field Programmable Gate Array, and IC stands for Integrated Circuit.

The processing unit 30 executes the design support program according to the present embodiment stored in the storage unit 20. Thus, as illustrated in FIG. 5, the processing unit 30 functions as a reproduction information recording unit 31, a visibility state reproduction unit 32, a new viewpoint reproduction unit 33, a portion-of-interest viewpoint determination unit 34, a mark display control unit 35, a portion-of-interest viewpoint grouping unit 36, and a viewpoint moving unit 37. FIG. 5 illustrates an example of the functional configuration of the processing unit illustrated in FIG. 3.

Figure 6:
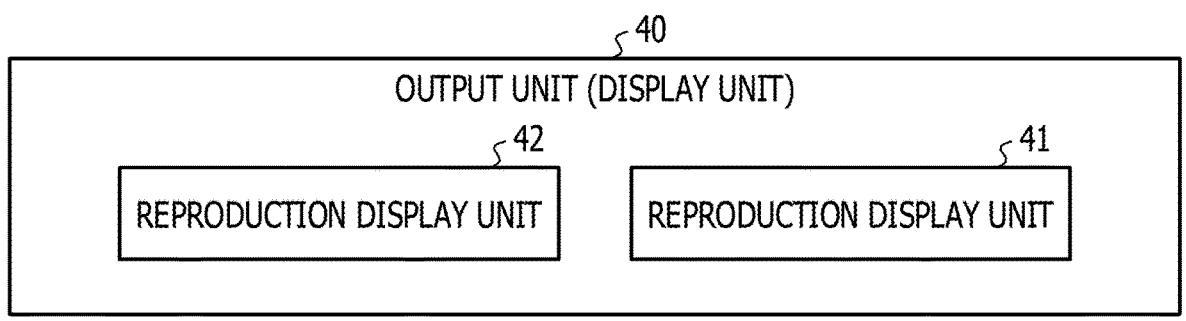
FIG. 6 illustrates an example of the functional configuration of an output unit illustrated in FIG. 3.

The output unit 40 includes a display unit in which the visibility state is controlled by the variety of functions provided by the processing unit 30 executing the design support program according to the present embodiment. A variety of output devices, such as a liquid crystal display, an organic electroluminescence (EL) display, a plasma display, a projector, and a printer, may be used as the output unit 40. As illustrated in FIG. 6, the output unit (the display unit) 40 functions as a reproduction display unit 41 and a reproduction mark display unit 42 by using the variety of functions provided by the processing unit 30. FIG. 6 illustrates an example of the functional configuration of the output unit illustrated in FIG. 3.

The processing unit 30 is a functional unit that performs processing by using the information, such as shape data, stored in the storage unit 20. The output unit 40 is a unit for visualizing data generated by the storage unit 20 and the processing unit 30.

The information processing apparatus 1 may include a communication interface and a medium reading unit. The communication interface performs connection with another apparatus and control of communication with the apparatus via a network. Examples of the communication interface include an adapter conforming to Ethernet (registered trademark) or optical communication (for example, Fiber Channel) and a network interface card, such as a local area network (LAN) card. By using the communication interface, a program, for example, may be downloaded via a network (not illustrated).

The medium reading unit is a reader that reads out data and programs stored on the recording medium and loads the data and program onto the storage unit 20 or inputs the data and program to the processing unit 30. Examples of the medium reading unit include an adapter conforming to Universal Serial Bus (USB) or the like, a drive unit for accessing a recording disk, and a card reader for accessing a flash memory, such as an SD card. A program, for example, may be stored in the recording medium.

An example of a recording medium is a non-transitory computer-readable recording medium, such as a magnetic/optical disk or a flash memory. Examples of a magnetic/optical disk include a flexible disk, a Compact Disc (CD), a Digital Versatile Disc (DVD), a Blu-ray Disc, and a Holographic Versatile Disc (HVD). An example of a flash memory is a semiconductor memory, such as a USB memory or an SD card. Note that examples of a CD include a CD-ROM, a CD-R, and a CD-RW. Examples of a DVD include a DVD-ROM, a DVD-RAM, a DVD-R, a DVD-RW, a DVD+R, and a DVD+RW.

The storage unit 20 stores structural data of a three-dimensional assembly model of a product to be designed and the part information 21 including information about each of a plurality of parts that constitute the product to be designed (for example, the shape data of each of the parts, refer to FIG. 7). The part information 21 is input from, for example, the input unit 10, the above-described communication interface, or the medium reading unit, and is stored in the storage unit 20.

FIG. 7 illustrates an example of the details of the recorded part information illustrated in FIG. 4. In FIG. 7, for example, the shape data of each of the parts is illustrated. In FIG. 7, the shape data of a part having the part ID "A", that is, the part A is recorded. As the shape data of the part A, the three-dimensional coordinates (the vertex coordinates) of each of the vertices of the part A are recorded in association with one of vertex IDs (point 1, point 2, . . . ) that identify the vertices of the part A, and the vertex IDs of each of the faces of the part A are recorded in association with one of face IDs (face 1, face 2, . . . ) that identify the faces of the part A.

The storage unit 20 stores the defect information 22 and the viewpoint reproduction information 23 illustrated in FIGS. 8 to 11. If a defective portion is detected, the defect information 22 and the viewpoint reproduction information 23 regarding the defective portion are acquired and stored in the storage unit 20 by the reproduction information recording unit 31.

FIG. 8 illustrates an example of the details of the recorded defect information illustrated in FIG. 4. In FIG. 8, the details of a defect (for example, "insufficient strength around the button hole of the upper cover") and a viewpoint reproduction information ID (for example, Viewinfo001) for identifying the viewpoint reproduction information 23 of the defect are recorded as the defect information 22 in association with a defect ID (for example, 1d3×) for identifying a defect that occurred. The viewpoint reproduction information 23 is used to reproduce the viewpoint and the visibility state corresponding to the portion of interest (in this example, the defective portion at the time of occurrence of the defect). The viewpoint reproduction information 23 includes the field-of-view information 231 and the measurement information 232.

FIG. 9 illustrates an example of the details of the viewpoint reproduction information illustrated in FIG. 4. In FIG. 9, a field-of-view information ID, a visible ID, an invisible part ID, a translucent part ID, and an image ID are recorded in association with the viewpoint reproduction information ID (for example, Viewinfo001) for identifying the viewpoint reproduction information 23. The field-of-view information ID (for example, View001) identifies the field-of-view information 231 (refer to FIG. 10) regarding the field of view from the viewpoint when viewing the defective portion on the display unit at the time of occurrence of a defect. The visible ID (for example, Visible001) identifies the measurement information 232 (refer to FIG. 11) regarding the measurement result of each of the parts located within the field of view defined by the field-of-view information 231 for the ID "View001", for example. The invisible part ID (for example, part ID "C") identifies an invisible part having a visibility state of "invisible". The translucent part ID identifies a translucent part having a visibility state of "translucent". In FIG. 9, "—(hyphen)" is set so as to indicate that there is no translucent part. The image ID (for example, Image001) identifies an image of the defective portion displayed as a defective portion at the time of occurrence of a defect. The display data of the image is stored in a predetermined area of the storage unit 20 in association with the image ID. The image has a viewpoint and a field of view defined by the field-of-view information 231 having an ID of "View001".

FIG. 10 illustrates an example of the details of the recorded field-of-view information 231 (the field-of-view information ID "View001") associated with the viewpoint reproduction information 23 illustrated in FIG. 9. In FIG. 10, various kinds of information that define the field of view is recorded in association with the field-of-view information ID (for example, View001) identifying the field-of-view information 231. As the various kinds of information that define the field of view, three-dimensional coordinates (Xc, Yc, Zc) of the viewpoint position, a rotation angle (X$\theta$, Y$\theta$, Z$\theta$), a viewing angle (horizontal/vertical), a line-of-sight direction, the three-dimensional coordinates of the position of the intersection point, and the part ID (for example, A) of the intersection part are recorded. The position of the intersection point is the three-dimensional coordinates of the point at which the line of sight from the viewpoint intersects with the part. The position of the intersection point corresponds to the position of the point of interest. The intersection part ID is a part ID for identifying a part on which the above-described position of the intersection point is located, that is, a part that intersects with the above-described line of sight. The intersection part ID corresponds to the part-of-interest ID.

Figure 17:
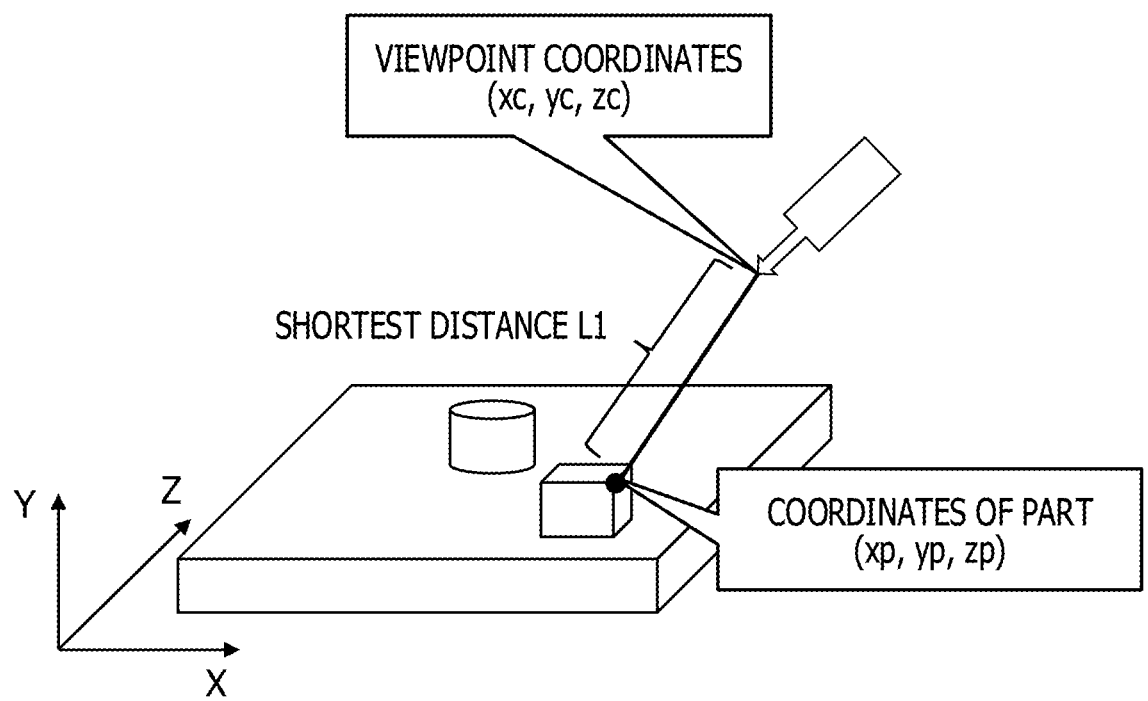
FIG. 17 illustrates an example of the shortest distance between a viewpoint and each of parts.
Figure 19:
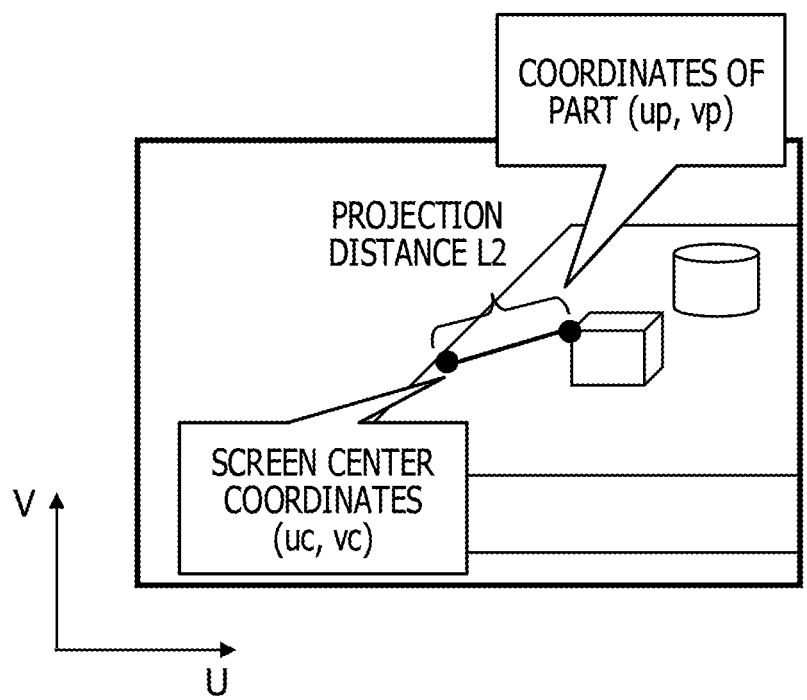
FIG. 19 illustrates an example of a projection distance between the screen center and each of the parts.

FIG. 11 is a view illustrating an example of the details of the recorded measurement information 232 (the display ID "Visible001") associated with the viewpoint reproduction information 23 illustrated in FIG. 9. In FIG. 11, a part ID (for example, A, B, or D) for identifying each of the parts located in the field of view is recorded in association with the visible ID (for example, Visible001). In the example illustrated in FIG. 11, the visible/invisible, shortest distance, projection distance, three-dimensional coordinates of the point of measurement, face IDs, and vertex IDs of each of the parts are recorded in association with a part ID. In terms of visible/invisible, "visible" is recorded when the part is identifiable in the field of view (detectable by the eye). In contrast, "invisible" is recorded when the part is unidentifiable in the field of view (undetectable by the eye). The shortest distance is the shortest distance (for example, the first shortest distance) between the viewpoint and the part as illustrated in FIG. 17. As illustrated in FIG. 19, the projection distance is a projection distance between the screen center (for example, the center of the first screen) of the display screen (for example, the first display screen) for displaying the parts as viewed from the viewpoint and the part (for example, the first projection distance). As described above, the point of measurement (for example, the measure point) of each of the parts correspond to a point (for example, a vertex) on the part when the shortest distance between the viewpoint and the part is calculated. The face ID of the point of measurement identifies a face of the part where the point of measurement is located. The vertex ID of the point of measurement identifies a vertex on the part corresponding to the point of measurement.

A variety of functions performed by the processing unit 30 and the output unit 40 include the reproduction information recording unit 31, the visibility state reproduction unit 32, the new viewpoint reproduction unit 33, the portion-of-interest viewpoint determination unit 34, the mark display control unit 35, the portion-of-interest viewpoint grouping unit 36, the viewpoint moving unit 37, the reproduction display unit 41, and the reproduction mark display unit 42.

If a defect occurs in a design phase, the reproduction information recording unit 31 may define one of a plurality of parts included in the three-dimensional assembly model as a portion of interest (for example, a part of interest, a defective portion). Thereafter, the reproduction information recording unit 31 may acquire the defect information 22 and the viewpoint reproduction information 23 regarding the portion of interest (refer to FIGS. 8 to 11) and record the information in the storage unit 20.

The reproduction information recording unit 31 may automatically record the viewpoint reproduction information 23 if displayed view from a certain viewpoint satisfies a predetermined condition (for example, the view is continuously displayed for a predetermined time period or longer) by the operation performed by, for example, the designer.

By using the defect information 22 and the viewpoint reproduction information 23 recorded in the storage unit 20, the visibility state reproduction unit 32 displays, on the output unit 40, the reproduced visibility state focused on the defective portion at the time of occurrence of the defect in the three-dimensional assembly model whose design has progressed or the visibility state of the portion of interest seen from the viewpoint that the designer, for example, frequently uses. At this time, the reproduction display unit 41 is a function provided by controlling the display state of the output unit 40 by the visibility state reproduction unit 32. The reproduction display unit 41 visualizes the visibility state of the portion of interest on the output unit (the display unit) 40 and displays the reproduced image of the portion of interest.

If a difference (for example, an offset) is generated between the point of measurement of each of the parts at the time of recording the defect information 22 and the viewpoint reproduction information 23 and the point of measurement of the current part (the part after the design has progressed), the new viewpoint reproduction unit 33 changes the viewpoint position based on the difference. At this time, the new viewpoint reproduction unit 33 acquires one or more offset viewpoints as viewpoint candidates (for example, the candidates of a new viewpoint) based on the difference.

By using the priority determination value (for example, the priority) or the similarity of the feature amount, the portion-of-interest viewpoint determination unit 34 selects, as a new viewpoint, one of the viewpoints for the portion of interest and the one or more viewpoint candidates at the time of recording. For example, the portion-of-interest viewpoint determination unit 34 compares the priority determination values and the viewpoint images (the similarities of the feature amounts of the viewpoint images obtained by machine learning) for the viewpoints with one another. The portion-of-interest viewpoint determination unit 34 determines the viewpoint having the smallest priority determination value (for example, the highest priority) or the highest similarity as a new viewpoint for the portion of interest.

Figure 23:
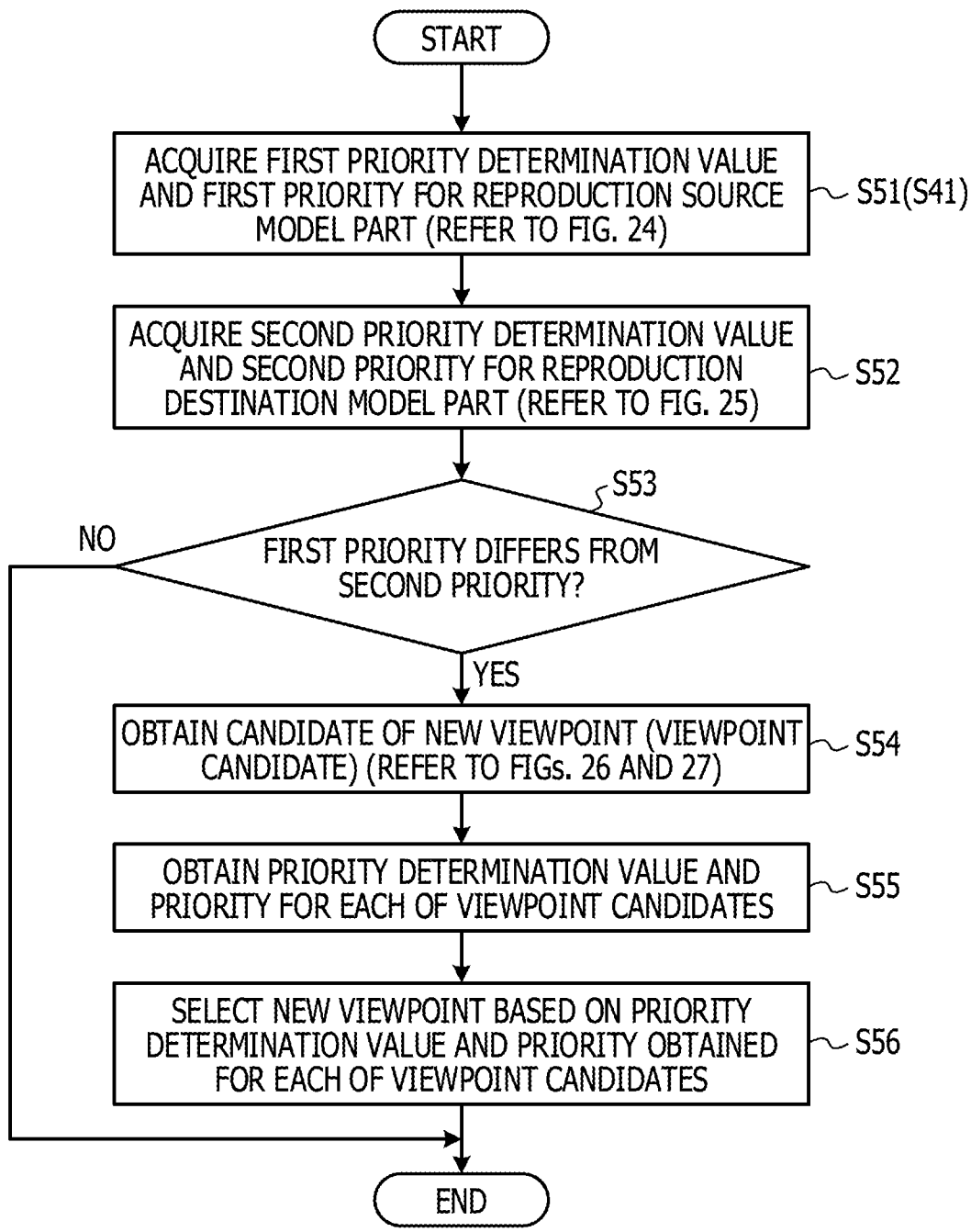
FIG. 23 illustrates an example of the processes in operations S5 and S6 illustrated in FIG. 12.

The above-described functions serving as the new viewpoint reproduction unit 33 and the portion-of-interest viewpoint determination unit 34 are implemented by the design support program according to the present embodiment, which causes the computer 1 (the processing unit 30) to perform processes (21) to (24) described below (refer to FIG. 23).

Process (21) calculates, for each of the parts (the reproduction source model parts) at the time of occurrence of a defect (for example, at a first time point) in a design phase, a first priority determination value used to determine a first priority for displaying the part based on the first shortest distance between one viewpoint and the part and a first projection distance (refer to FIG. 24). The first projection distance is a projection distance between the first screen center of the first display screen and the part. Note that the first display screen displays the part of interest as viewed from the viewpoint at the time of occurrence of a defect.

Process (22) calculates, for each of the parts (for example, the reproduction source model parts) at the current time after a defect occurred (for example, at a second time point), a second priority determination value used to determine a second priority for displaying the part at the current time based on the second shortest distance between one viewpoint and the part and a second projection distance (refer to FIG. 25). The second projection distance is a projection distance between a second screen center of a second display screen and the part. Note that the second display screen displays the part as viewed from the viewpoint at the current time.

If the first priority differs from the second priority, the process (23) selects, as a new viewpoint, one among the one viewpoint and the one or more viewpoint candidates based on third priority determination values. The third priority determination value corresponds to the second priority determination value and is calculated, for each of one or more viewpoint candidates other than the one viewpoint (refer to FIGS. 26 and 27), by replacing the one viewpoint with the viewpoint candidate. The first priority and the second priority are determined by the first priority determination value and the second priority determination value, respectively.

Process (24) displays, on the output unit (the display unit) 40, the reproduced image of the part (for example, the part of interest) at the time of occurrence of a defect as viewed from the new viewpoint selected by the process (23).

At this time, the processing unit 30 calculates the first priority determination value such that the first priority determination value decreases as a part at the time of occurrence of a defect is closer to the first screen center and determines the first priority of the part such that the first priority increases as the first priority determination value of the part decreases. The processing unit 30 calculates the second priority determination value such that the second priority determination value decreases as a part at the current time is closer to the second screen center and determines the second priority of the part such that the second priority increases as the second priority determination value of the part decreases. For example, a value obtained by multiplying the value of the first shortest distance by the square value of the first projection distance is used as the first priority determination value, and the value obtained by multiplying the value of the second shortest distance by the square value of the second projection distance is used as the second priority determination value.

The processing unit 30 selects, as a new viewpoint, the smallest value among the sum of the second priority determination values of the respective parts calculated for one viewpoint and the sum of the third priority determination values of the parts calculated for each of the one or more viewpoint candidates.

The case where the first time point represents the time of the occurrence of a defect and the second time point represents the current time is discussed below. The one viewpoint is the viewpoint at the time of occurrence of a defect, and one or more viewpoint candidates are one or more offset viewpoints obtained by moving the one viewpoint with respect to the positions of the respective parts each having a first priority that differs from a second priority.

It is used to automatically setting a portion of interest, for example, to implement the automatic viewpoint recording function (13). In the function (13), as described above, when the viewpoint has not been moved or the visibility state has not been change for several seconds (a predetermined time period) after movement of the viewpoint, the reproduction information for the viewpoint and the viewpoint image at that time are automatically recorded.

When automatically setting a portion of interest, the portion-of-interest viewpoint grouping unit 36 groups, among the plurality of recorded viewpoints, the viewpoints having the points of interest physically close to one another. From among the plurality of viewpoints in the same group, one viewpoint (for example, a new viewpoint) is selected as the representative viewpoint by using the functions of the new viewpoint reproduction unit 33 and the portion-of-interest viewpoint determination unit 34, for example, the function (12).

The mark display control unit 35 controls the display state of the output unit 40 so that the reproduction mark described below with reference to FIGS. 28 to 31 and FIG. 34 is displayed on the reproduction mark display unit 42 of the output unit (the display unit) 40. For example, the reproduction mark display unit 42 is a function provided by the mark display control unit 35 controlling the display state of the output unit 40.

Figure 31:
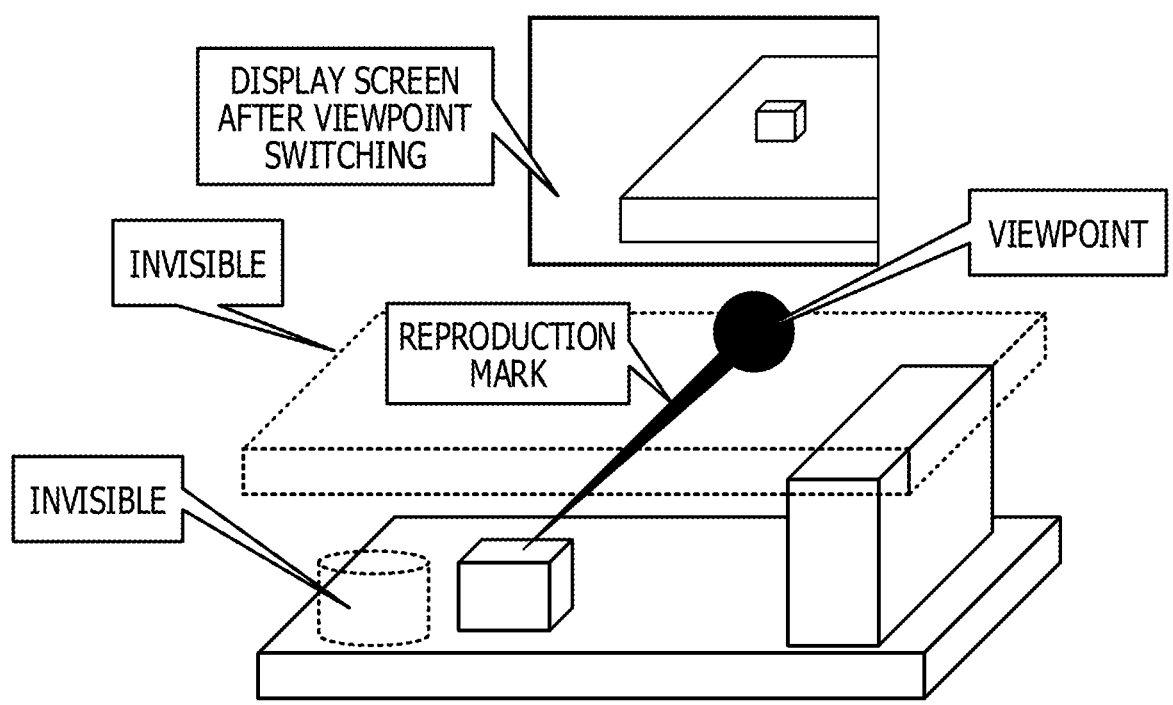
FIG. 31 illustrates an example of the visibility state seen during the preview and an example of a displayed reproduction mark.

In addition to displaying the reproduction mark which connects the viewpoint with the point of interest in the reproduction mark display unit 42 (refer to FIG. 29), the mark display control unit 35 may display a preview of the visibility state seen at the time of occurrence of a defect when the reproduction mark is hovered over with a cursor (refer to FIG. 31). At the time of preview, the mark display control unit 35 may display the viewpoint image and the model name of the portion of interest in the vicinity of the reproduction mark.

The mark display control unit 35 may switch the visibility state to the state viewed from the viewpoint indicated by the reproduction mark and display the reproduced image when an operation to select the reproduction mark is performed by using, for example, a mouse.

Figure 34:
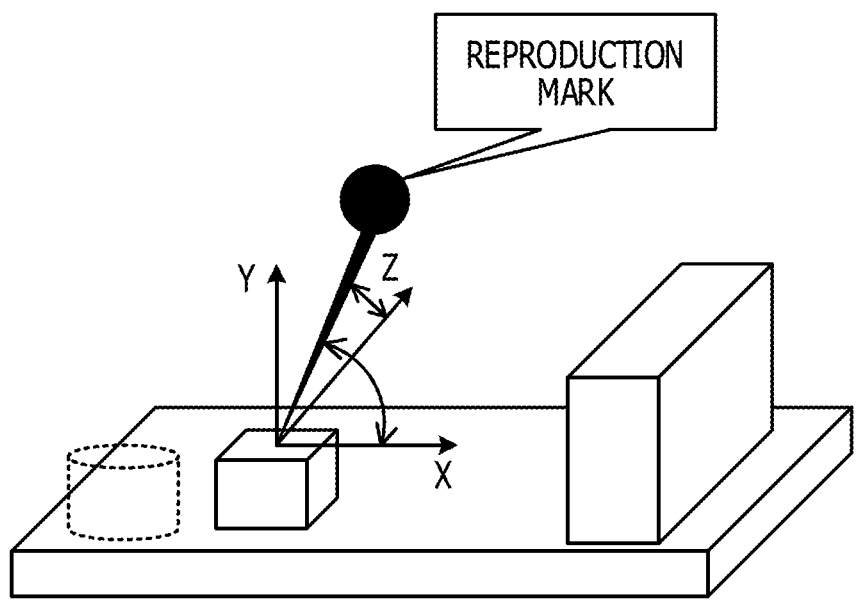
FIG. 34 illustrates an example of display control of the reproduction mark in accordance with the line-of-sight direction.

By using the angular difference between the current line of sight that connects the current viewpoint with the point of interest and the line of sight that connects the viewpoint of the reproduction mark and the point of interest, the mark display control unit 35 may perform control so as to display the reproduction mark close to the current viewpoint in the reproduction mark display unit 42 in distinction from the other reproduction marks (refer to FIG. 34). At this time, for example, the mark display control unit 35 may perform control so as to display, among the plurality of reproduction marks displayed in the reproduction mark display unit 42, only the reproduction marks close to the line-of-sight direction from the current viewpoint position.

The viewpoint moving unit 37 projects the line-of-sight direction (the viewpoint) of the reproduction mark onto the inclusive sphere of the three-dimensional assembly model to normalize the line-of-sight direction. Thereafter, the viewpoint moving unit 37 selects the next projection viewpoint that is close in distance to the current viewpoint on the inclusive sphere in response to an instruction from the input unit 10 through an arrow key operation performed on the keyboard or a scroll operation using a mouse. For example, in response to an instruction from the input unit 10, the viewpoint moving unit 37 sequentially selects, from among the plurality of reproduction marks projected onto the inclusive sphere, the ones that are close in distance to the current viewpoint. In this manner, the viewpoint moving unit 37 moves the viewpoint of the viewpoint image to be displayed to the viewpoint associated with the selected reproduction mark (refer to FIG. 35) and, thus, reproduces, on the display unit 40, the visibility state as viewed from the moved viewpoint.

Figure 12:
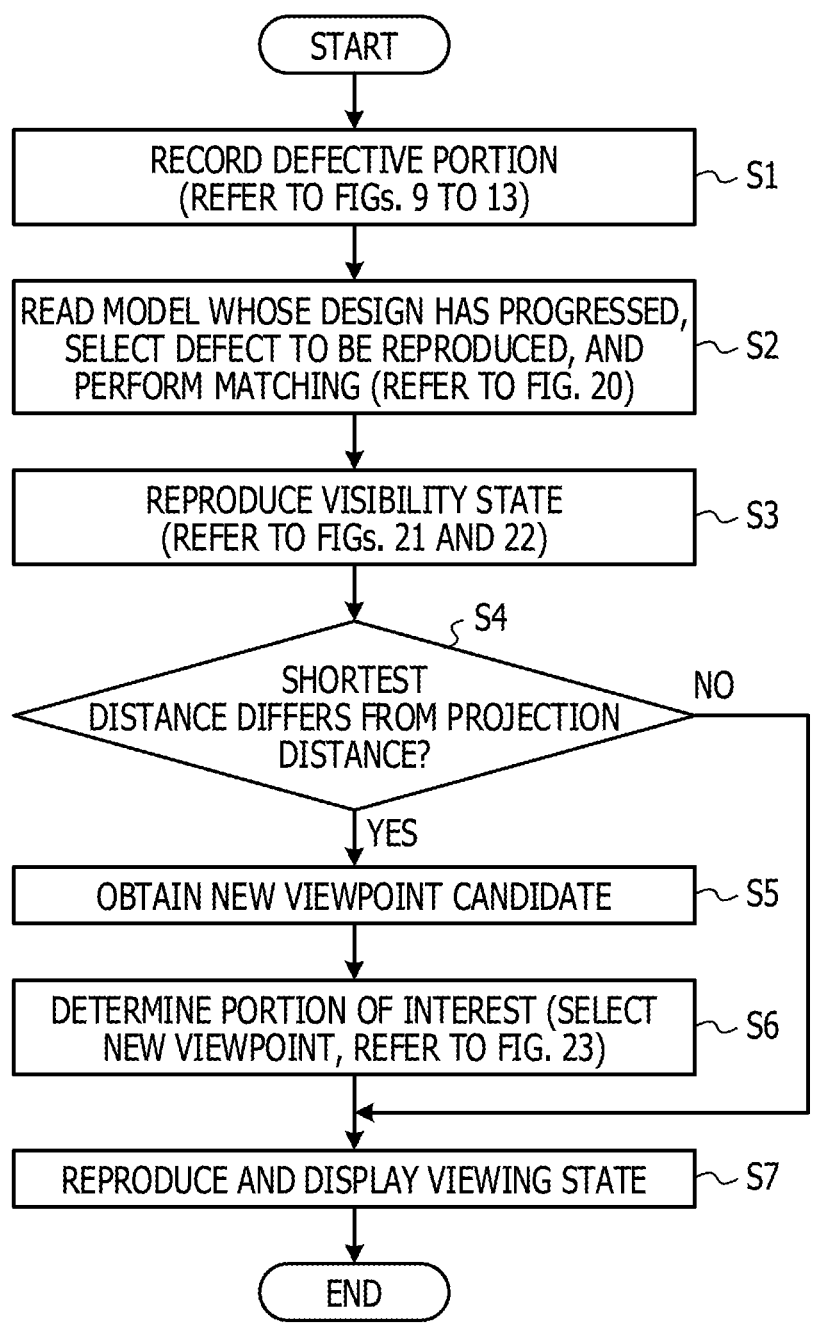
FIG. 12 illustrates an example of the procedure for recording and reproducing a defective portion.

In FIG. 12, the defect information 22 and the viewpoint reproduction information 23 regarding the defective portion (the pointed-out portion), in which a defect occurred, may be recorded. In addition, the three-dimensional assembly model updated in accordance with the progress of design may be reflected in the visibility state in the output unit 40.

As illustrated in FIG. 12, if a defect occurs in the design phase of the product to be designed, a portion in which the defect occurs (a defective portion) is detected as a portion of interest (a part of interest) and is displayed on the output unit 40. As described above, the defect information 22 and the viewpoint reproduction information 23 (refer to FIGS. 8 to 11) including the viewpoint and the visibility state at the time of displaying the defective portion are acquired by the reproduction information recording unit 31 and the input unit 10 and are recorded in the storage unit 20 (operation S1).

When the designer or the like references and checks the defective portion recorded in the storage unit 20 after recording and storing, for example, the defect information 22 and the viewpoint reproduction information 23 regarding the defective portion in the storage unit 20 in operation S1, a model whose design has progressed, that is, the reproduction destination model is read. The defect to be reproduced from the defect information 22, that is, the reproduction source model is selected, and matching between the reproduction destination model and the reproduction source model is performed (operation S2).

Thereafter, in accordance with the determination result of matching, the reproduced visibility state of the selected defective portion is displayed in the state in which the model whose design has progressed is displayed (that is, in the reproduction destination model) based on the viewpoint reproduction information 23 (operation S3).

With the visibility state of the defective portion being reproduced in operation S3, it is determined whether the shortest distance L1 (refer to FIG. 17) between the viewpoint and the part differs from the projection distance L2 (refer to FIG. 19) between the part and the screen center of the screen displaying the parts as viewed from the viewpoint (operation S4).

If the difference between the shortest distance L1 and the projection distance L2 is zero, that is, if the shortest distance L1 is the same as the projection distance L2 ("NO" path in operation S4), the shape and the layout position of each of the parts remain unchanged between the reproduction source model and the reproduction destination model. Thus, the viewing state displayed in operation S3 is reproduced and displayed without any change (operation S7).

However, if the difference between the shortest distance L1 and the projection distance L2 is not zero, for example, if the shortest distance L1 is not the same as the projection distance L2 ("YES" path in operation S4), the shape or the layout position of each of the parts has been changed and, thus, the processes in operations S5 to S7 are performed.

If, in operation S5, an offset is generated between the point of measurement of each of the parts at the time of recording a defect and the point of measurement of the part after the design progresses, one or more offset viewpoint are acquired as the candidates for a new viewpoint based on the offset through the function that serves as the new viewpoint reproduction unit 33.

In operation S6, through the function serving as the portion-of-interest viewpoint determination unit 34, one among the viewpoint for the portion of interest at the time of recording and one or more viewpoint candidates is selected as a new viewpoint based on the priority determination value (the priority) or the similarity between the feature amounts. For example, for each of the viewpoints, the priority determination value or the viewpoint image (the similarity between the feature amounts of the viewpoint images obtained by machine learning) is compared with that of the viewpoint for the portion of interest at the time of recording, and a viewpoint having a low priority determination value, that is, a viewpoint having a high priority or a viewpoint having a high similarity is adopted as a new viewpoint for the portion of interest.

In operation S7, through the function serving as the visibility state reproduction unit 32, the visibility state focused on the defective portion at the time of occurrence of a defect is reproduced in the three-dimensional assembly model whose design has progressed and is displayed on the output unit (the display unit) 40 with the viewpoint moved to the new viewpoint.

For example, for the visibility state of the three-dimensional assembly model whose pointed-out item including the defect information or the like is being generated, the visual distance from the viewpoint to the face of each of the visible parts in the display area (the area of the field of view) and the location of the part in the display area (the two-dimensional coordinates in the image) may be recorded in addition to the viewpoint position relative to the origin of the target three-dimensional assembly model, the line-of-sight direction, the enlargement factor, and the visibility state of the part.

Figure 13:
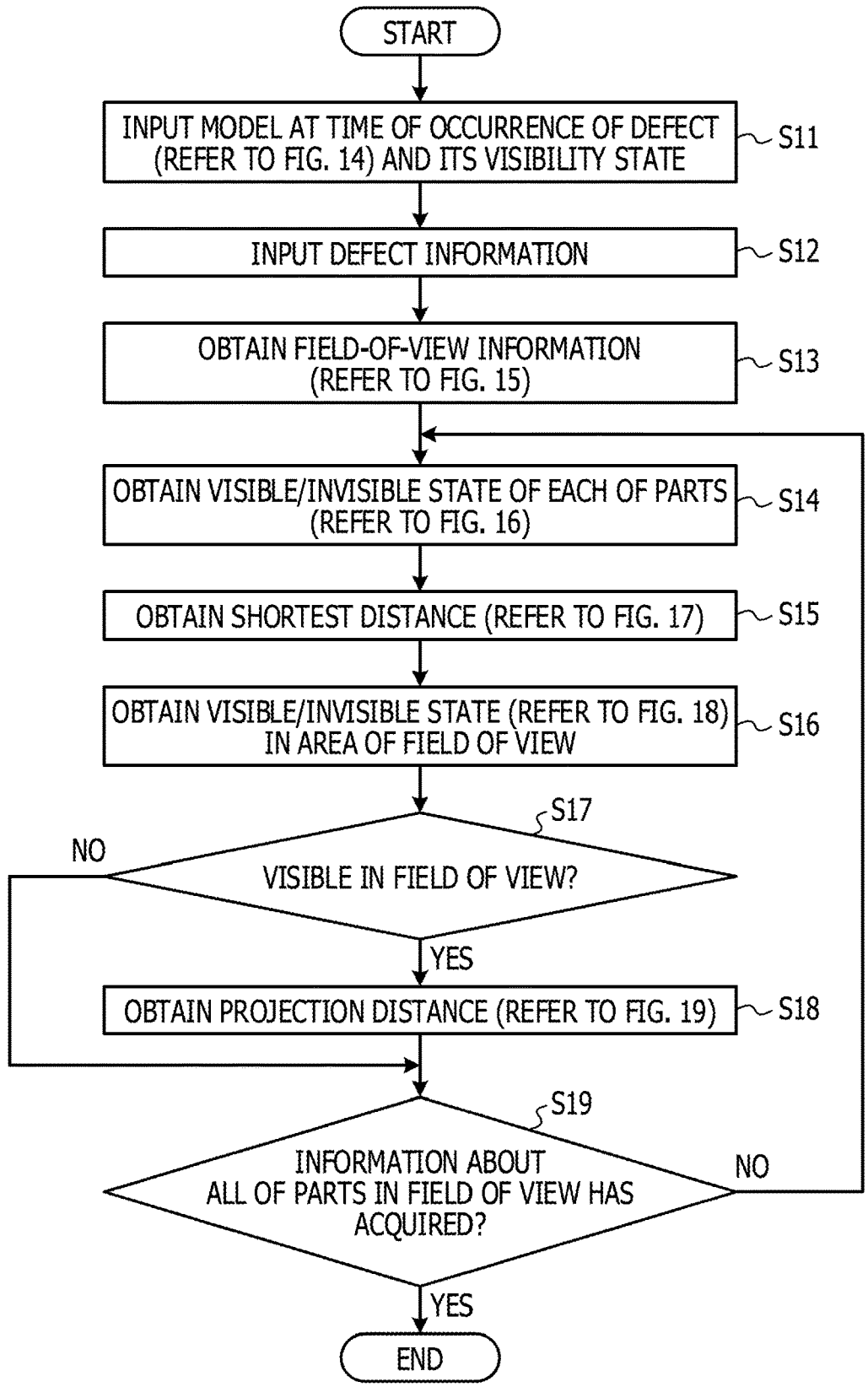
FIG. 13 illustrates an example of the process in operation S1 illustrated in FIG. 12.
Figure 14:
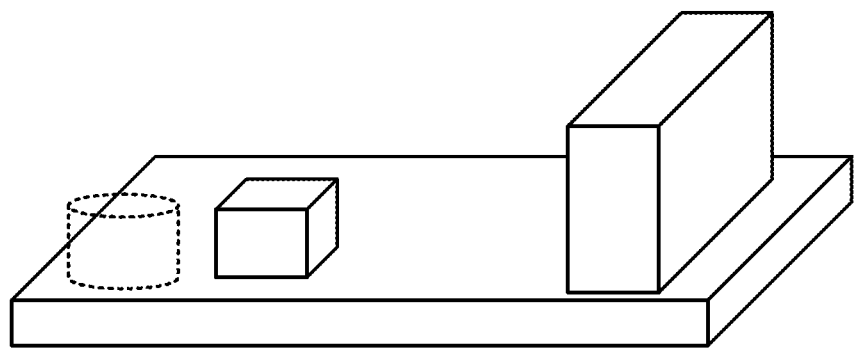
FIG. 14 illustrates an example of a three-dimensional assembly model at the time of occurrence of a defect.

As illustrated in FIG. 13, if a defect occurs in the design phase of the product to be designed, the three-dimensional assembly model at the time of occurrence of the defect and its visibility state are input by, for example, the designer operating the input unit 10. For example, a three-dimensional assembly model at the time of occurrence of the defect and its visibility state illustrated in FIG. 14 are input (operation S11). FIG. 14 illustrates an example of a three-dimensional assembly model at the time of occurrence of a defect.

At this time, as illustrated in FIG. 8, the details of the defect serving as the defect information 22 are input by, for example, the designer operating the input unit 10. The details of the defect are recorded in the storage unit 20 in association with the defect ID identifying the defect and the viewpoint reproduction information ID identifying the viewpoint reproduction information 23 regarding the defect (operation S12).

Figure 15:
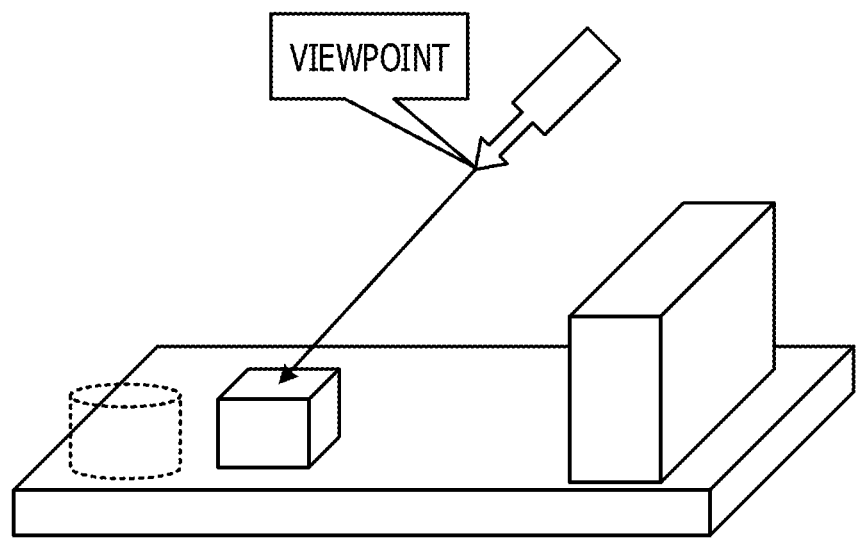
FIG. 15 illustrates an example of the field-of-view information.

When a defect occurs, the field-of-view information 231 (refer to FIG. 10) included in the viewpoint reproduction information 23 is acquired and recorded in the storage unit 20 by the reproduction information recording unit 31 (operation S13). The field-of-view information 231 includes orientation information of the viewpoint acquired from the visibility state at the time of occurrence of the defect. The orientation information of the viewpoint includes the viewpoint position (refer to FIG. 15), the rotation angle, the viewing angle, and the line-of-sight direction (refer to an arrow in FIG. 15) with respect to the initial position of the viewpoint (the origin (0, 0, 0) of the global coordinate system). FIG. 15 illustrates the field-of-view information 231.

Figure 16:
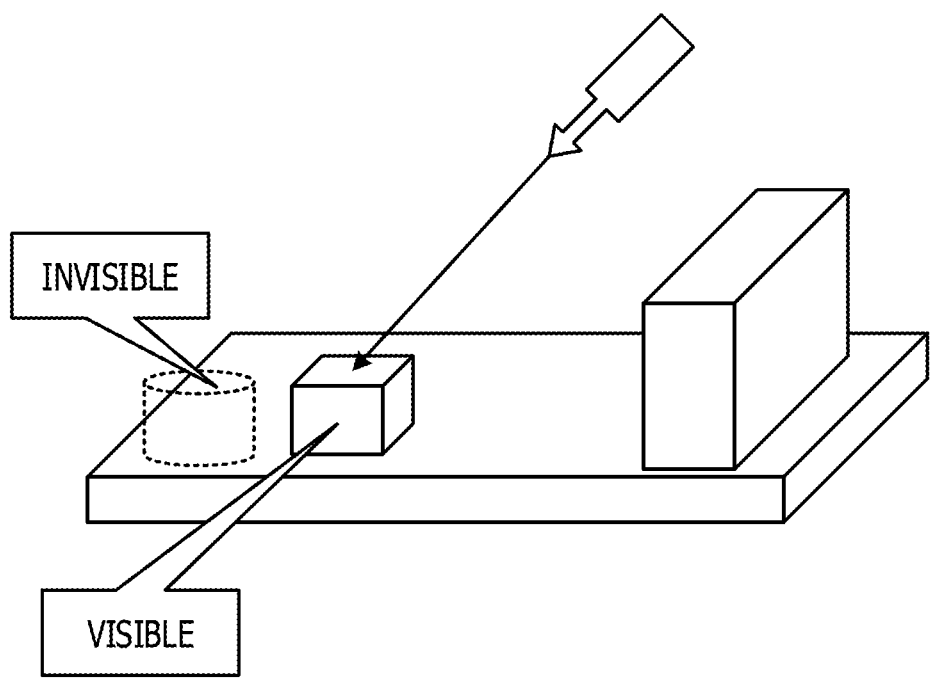
FIG. 16 illustrates the visible/invisible state of a model part.

As illustrated in FIG. 16, the visible/invisible state of each of the parts is acquired and is recorded in the storage unit 20 by the reproduction information recording unit 31 (operation S14). Information about the visible/invisible state is included in the viewpoint reproduction information 23. By recording the part ID identifying a part in the invisible state as an invisible part ID (refer to the part ID "C" in FIG. 9), the part with the invisible part ID is not displayed in the screen, as illustrated in FIG. 16. In contrast, parts each having a part ID other than an invisible part ID are displayed in the screen, as illustrated in FIG. 16. FIG. 16 illustrates the visible/invisible state of a model part.

As illustrated in FIG. 17, the shortest distance (corresponding to the first shortest distance) L1 from the viewpoint coordinates (xc, yc, zc) indicating the viewpoint position at the time of occurrence of a defect is calculated. The point (the vertex: the coordinates (xp, yp, zp)) on each of the parts at the time of calculating the shortest distance L1 is acquired as the point of measurement of the part. For example, the shortest distance L1 may correspond to the distance between the viewpoint coordinates (xc, yc, zc) and the point-of-measurement coordinates (xp, yp, zp). As illustrated in FIG. 11, the shortest distance L1 acquired at the time of occurrence of a defect in the above-described manner is recorded in the storage unit 20 as the measurement information 232 (operation S15). The shortest distance L1 may be acquired by the processing unit 30 and be recorded by the reproduction information recording unit 31. FIG. 17 illustrates the shortest distance L1 (corresponding to the first shortest distance) between the viewpoint and the part.

Figure 18:
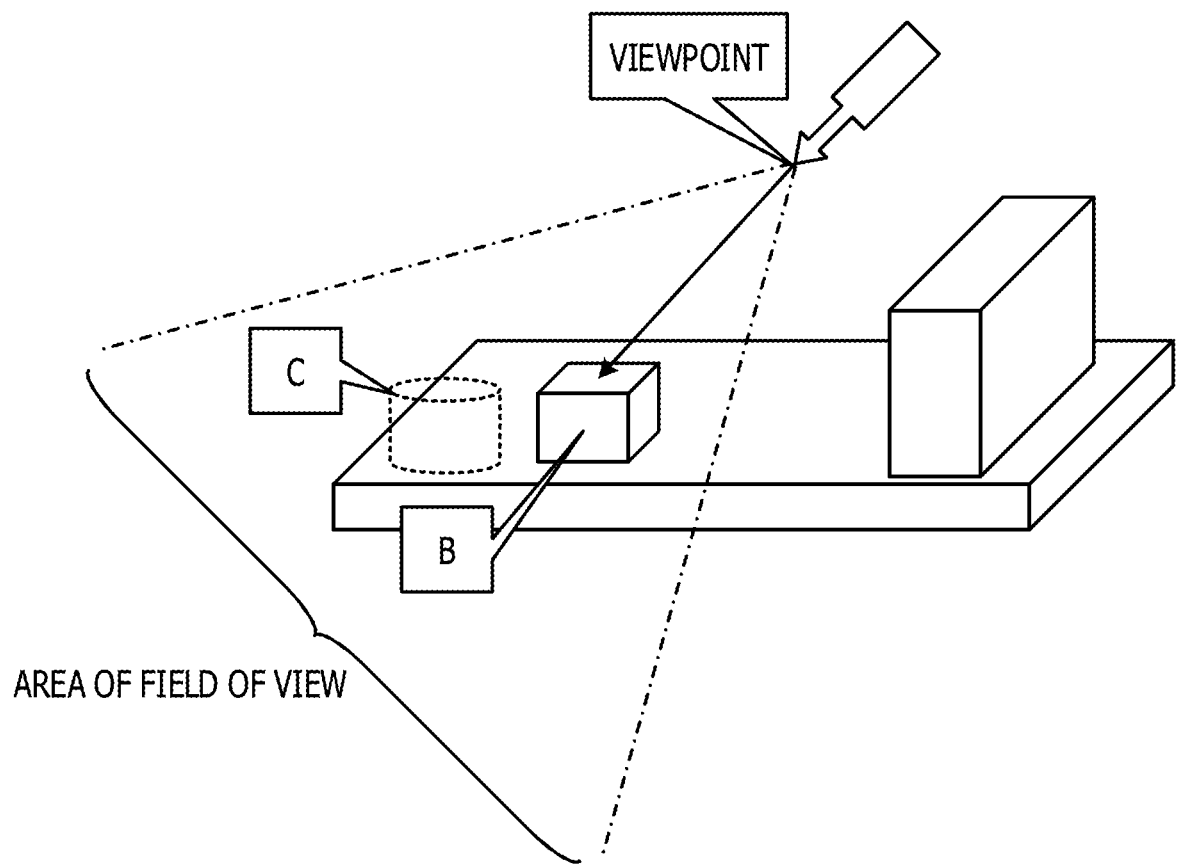
FIG. 18 illustrates an example of the visible/invisible within the area of the field of view.

Information as to whether each of the parts located in the area of the field of view based on the viewpoint at the time of occurrence of a defect is visible or invisible, for example, information as to whether each of the parts is identifiable or unidentifiable within the area of the field of view is acquired by the reproduction information recording unit 31 and is recorded as visible/invisible information (refer to FIG. 11) (operation S16). In FIG. 18, the part B of the visibility state in the area of the field of view is recorded as a visible in the measurement information 232, and the part C of the invisible state in the area of the field of view is recorded in the measurement information 232 as an invisible. FIG. 18 illustrates a visible/invisible in the area of the field of view.

Thereafter, it is determined whether each of the parts is visible within the area of the field of view (operation S17). If the target part is invisible ("NO" path in operation S17), the processing of the processing unit 30 (the reproduction information recording unit 31) proceeds to operation S19.

However, if the target part is visible ("YES" path in operation S17), the projection distance L2 (for example, the first projection distance) between the screen center of the display screen that displays the parts as viewed from the viewpoint at the time of occurrence of a defect (for example, the first screen center of the first display screen) and the target part is calculated. For example, as illustrated in FIG. 19, the length of a line extending between the following two is calculated as the projection distance L2: the screen center (uc, vc) of the viewpoint image (for example, the display screen) and the coordinates (up, vp) of a point obtained by projecting the vertex coordinates of the target part at the time of obtaining the shortest distance L1 (for example, the point-of-measurement coordinates (xp, yp, zp)) onto the viewpoint image. As illustrated in FIG. 11, the calculated projection distance L2 is recorded together with the point-of-measurement coordinates (xp, yp, zp) and the face ID and the vertex ID of the model part having the point of measurement thereon in association with the part ID of the target part (operation S18). The projection distance L2, the point-of-measurement coordinates (xp, yp, zp), the face ID, and the vertex ID may be acquired by the processing unit 30 and may be recorded by the reproduction information recording unit 31. FIG. 19 illustrates the projection distance (for example, the first projection distance) L2 between the screen center and each of the parts.

In operation S19, the reproduction information recording unit 31 determines whether the information about all of the parts located in the area of the field of view has been acquired. If the information about all parts in the field of view area has been acquired ("YES" path in operation S19), the processing unit 30 (the reproduction information recording unit 31) completes the recording of the defective portion. However, if the information about all of the parts in the view area has not been acquired ("NO" path in operation S19), the processing of the processing unit 30 (the reproduction information recording unit 31) returns to operation S14, where the information acquisition process for the parts whose information has not been acquired is continuously performed.

When the designer or the like references and checks the defective portion recorded in the storage unit 20, the design progression model input from the input unit 10 by the designer or the like or from another system, that is, the reproduction destination model is read in operation S2 illustrated in FIG. 12 (operation S21). The reproduction destination model is a three-dimensional assembly model, as illustrated in FIG. 14. The reproduction destination three-dimensional assembly model read in this manner is displayed on the output unit 40.

In response to the operation performed on the input unit 10 by the designer or the like, the defect ID of a defect to be reproduced from the defect information 22 illustrated in FIG. 8, that is, the reproduction source model is selected (operation S22).

Thereafter, matching is performed between the parts in the model information of the selected defect information and the information regarding the three-dimensional assembly model, which is the reproduction destination model (operation S23). For example, matching is performed between the parts of the reproduction source model and the parts of the reproduction destination model. In this manner, it is determined whether the part corresponding to both the reproduction source model and the reproduction destination model is found (the presence of matching data).

Matching may be performed by automatically or manually determining the presence of the parts having matched part IDs by using a unique part ID. The matching determination result is used in the processes in operations S32 and S33 illustrated in FIG. 21.

In the process in operation S3 illustrated in FIG. 12, the processing unit 30 (for example, the visibility state reproduction unit 32) reproduces the visibility state at the time of occurrence of a defect by using the model whose design has progressed after the occurrence of the defect (for example, the reproduction destination model) based on the recorded viewpoint reproduction information 23 in a manner described below.

Initial reproduction is performed (operation S31). In the initial reproduction, by using the selected defect ID, the field-of-view information 231 (refer to FIG. 10) corresponding to the defect ID is extracted from the viewpoint reproduction information 23 (refer to FIG. 9). The position and orientation of the viewpoint are set to those at the time of occurrence of a defect based on the extracted field-of-view information 231. For example, by using the origin of the global coordinates, the position of the viewpoint is set to the viewpoint position (Xc, Yc, Zc) in the extracted field-of-view information 231. The viewpoint is set at a position obtained by rotating the orientation of the viewpoint (the direction of the line of sight) by the rotation angle (X$\theta$, Y$\theta$, Z$\theta$) in the extracted field-of-view information 231 with respect to the three axes X, Y, and Z, respectively.

In the initial reproduction, the parts located in the area of the field of view defined by the viewpoint in the extracted field-of-view information 231 and the like are identified. At this time, all of the parts which are at least partially displayed in the area of the field of view (for example, the display area) are identified, and the part IDs of the identified parts are acquired as the reproduction destination model ID.

Figure 20:
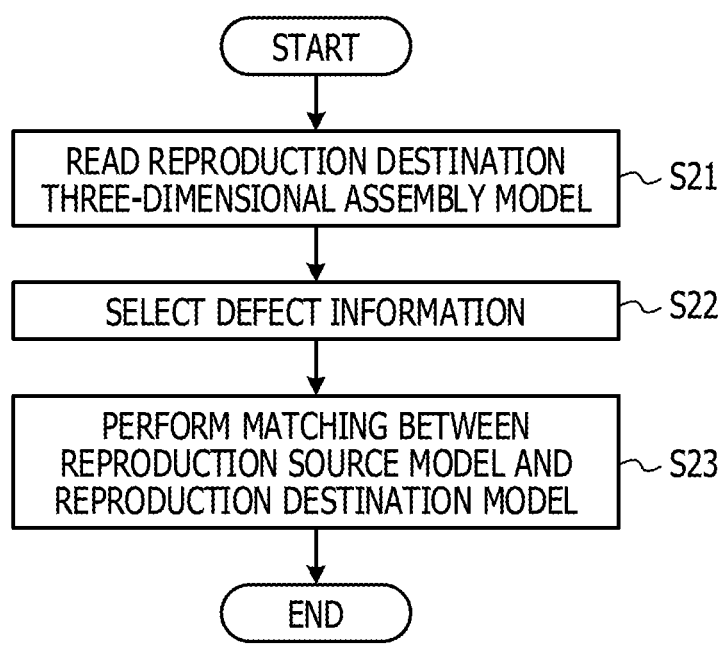
FIG. 20 illustrates an example of the process in operation S2 illustrated in FIG. 12.
Figure 21:
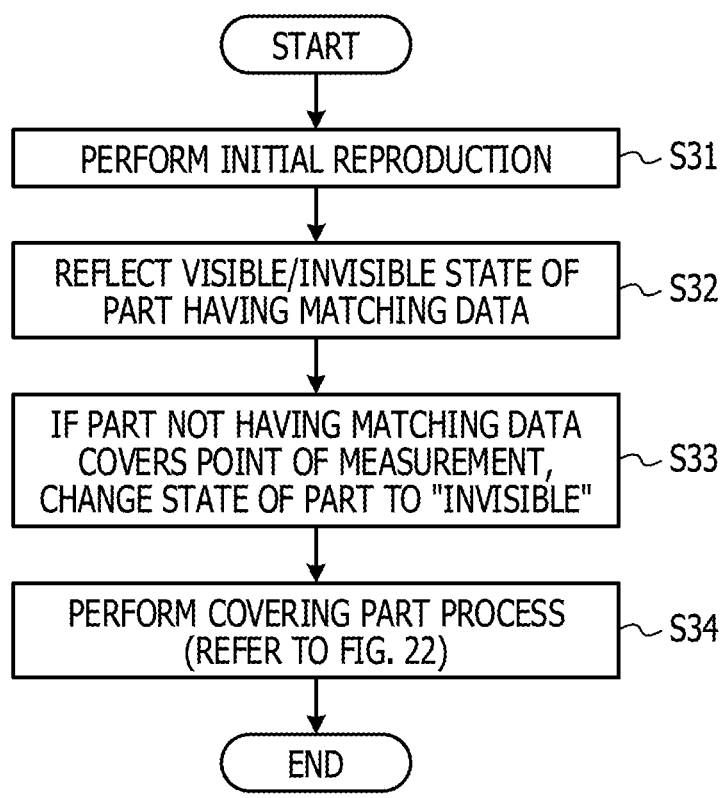
FIG. 21 illustrates an example of the process in operation S3 illustrated in FIG. 12.
Figure 22:
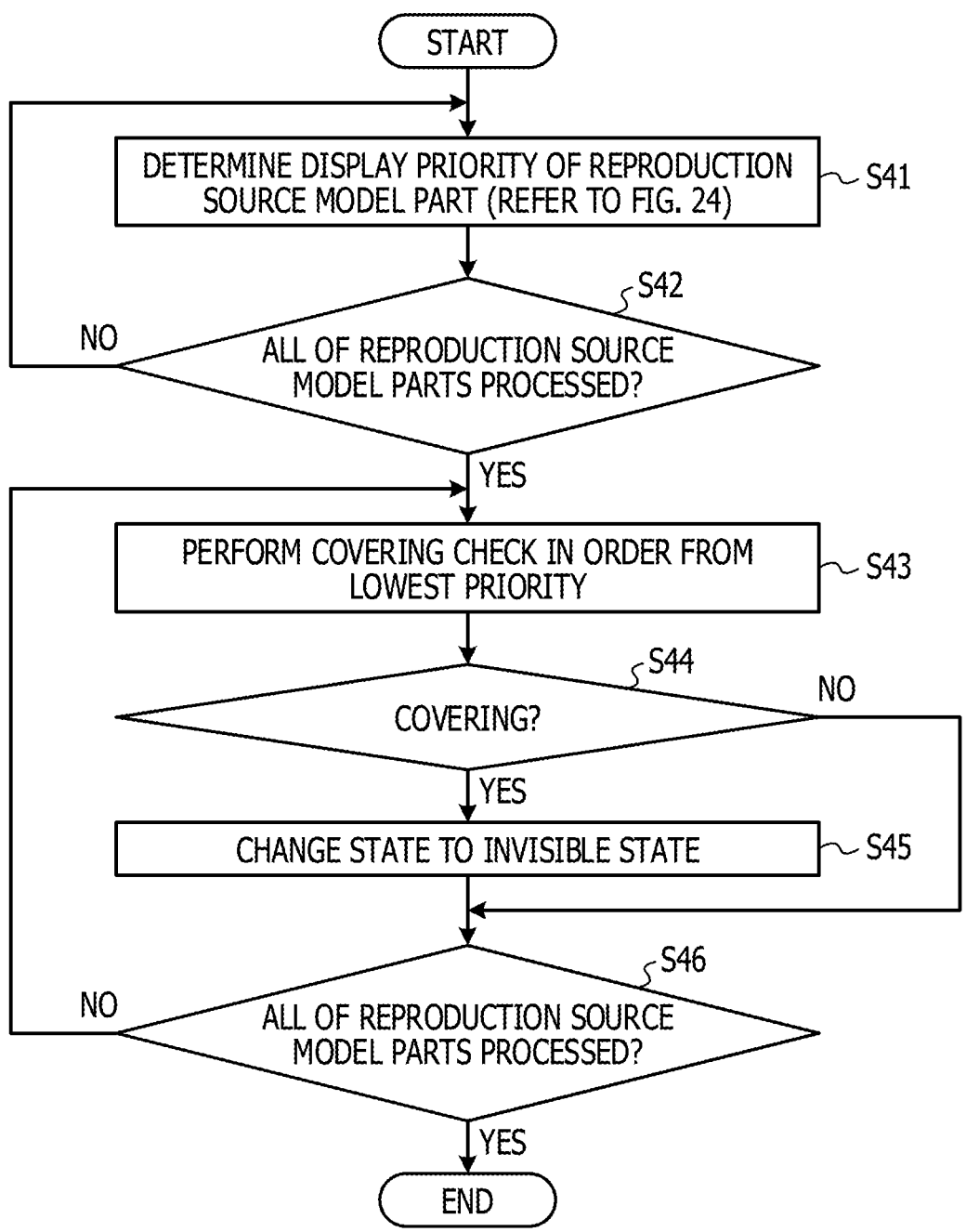
FIG. 22 illustrates an example of the process in the operation S34 illustrated in FIG. 21.

It is determined whether the reproduction source model part ID corresponding to the reproduction destination model part ID is able to be acquired for all of the reproduction destination model parts identified in operation S31 based on the matching determination result of the operation S23 illustrated in FIG. 20. If the reproduction source model part ID corresponding to the reproduction destination model part ID is able to be acquired, for example, if there is matching data, the reproduction destination model part having the matching data is displayed in accordance with the visible/invisible state of the corresponding reproduction source model part. That is, the setting of a visibility state is reflected (operation S32).

However, if the reproduction source model part ID corresponding to the reproduction destination model part ID is unable to be acquired, for example, if the part not having matching data is added, it is determined whether in the display area, the reproduction destination model part not having matching data covers the face having therein the point of measurement used for calculating the shortest distance. If the reproduction destination model part not having matching data does not cover the point of measurement, the current visibility state remains unchanged. However, if the reproduction destination model part not having the matching data covers the point of measurement, the state of the reproduction destination model part not having the matching data is changed to an invisible state (operation S33).

Thereafter, a covering part process (described below) is performed according to the priorities of visibility of the reproduction source model parts (step S34). If, in the visibility state currently reproduced, a part with a low priority covers a part with a high priority, the state of the part with the lower priority is changed to the invisible state through the covering part process.

The priority of the visibility of each of the reproduction source model parts is determined (operation S41). A priority determination value (for example, a first priority determination value) used to determine the priority (for example, a first priority) used to display the reproduction source model part is calculated based on the shortest distance L1 and the projection distance L2 of the reproduction source model part. The priority determination value is set to a value L1×L2×L2, which is obtained by multiplying the value of the shortest distance by the square value of the projection distance. The priority determination value decreases as the part is placed closer to the screen center, that is, with decreasing projection distance of the part. A higher display priority is assigned to a part placed closer to the screen center (for example, parts with a lower priority determination value).

For example, as illustrated in FIG. 24, when a priority determination value of 1000 is calculated as the priority determination value for the part A and a priority determination value of 2250 is calculated for the part B, the priority of the part A is set to a value higher than the priority of the part B. In FIG. 24, the priorities of the parts A and B are determined as "1" and "2", respectively. FIG. 24 illustrates an example of the first priority determination value and the first priority of a reproduction source model part.

The process in operation S41 is repeatedly performed until the priority is determined for all of the reproduction source model parts (a path from "NO" path in operations S42 to step S41). If the priorities are determined for all of the reproduction source model parts ("YES" path in operation S42), the covering check is performed in order from the lowest priority (operation S43).

In the covering check, it is determined whether the target reproduction source model part covers a part with a higher priority in the display area in ascending order of the priority, for example, in descending order of the priority determination value. At this time, the covering check is performed by determining whether the point of measurement of the reproduction destination model part that is the same as the measure point of the reproduction source model part (refer to FIG. 11) is visible or by determining whether the face having the point of measurement therein is visible. The determination may be made only for the parts with high priorities, for example, for the parts having the top two priorities.

If, as a result of the covering check, a part with a lower priority covers a part with a higher priority, for example, if the point of measurement is invisible ("YES" path in operation S44), the state of the target reproduction source model part is changed to an invisible state (operation S45). Thereafter, the processes in operations S43 to S45 are repeatedly performed until all of the reproduction source model parts are subjected to the covering check (a path from the "NO" path in operation S46 to step S43). Upon completion of the covering cover check for all of the reproduction source model parts ("YES" path in operation S46), the covering check ends. Note that if, as a result of the covering check, a part with a lower priority does not cover a part with a higher priority, for example, if the point of measurement is visible ("NO" path in operation S44), the processing proceeds to operation S46.

The processes in steps S5 and S6 illustrated in FIG. 12 are performed if it is determined that the shortest distance L1 differs from the projection distance L2 in the process in operation S4 illustrated in FIG. 12 ("YES" path in operation S4). For example, the processes in steps S5 and S6 are performed if the shape or layout position of the part has been changed. The processes are performed by the processing unit 30 (the visibility state reproduction unit 32, the new viewpoint reproduction unit 33, and the portion-of-interest viewpoint determination unit 34).

The priority determination value (for example, a first priority determination value) and the priority (for example, a first priority) for the reproduction source model part are acquired (operation S51). In terms of the viewpoint that is the same viewpoint for the reproduction source model part, the priority determination value (for example, a second priority determination value) and the priority (for example, a second priority) for the reproduction destination model part are acquired (operation S52). Since the process in operation S51 is substantially the same as the above-described process in operation S41, operation S51 may be replaced with operation S41.

In operation S51, as described above, a first priority determination value used to determine a first priority for displaying each of the reproduction source model parts is calculated based on the first shortest distance L1 and the first projection distance L2 of the reproduction source model part. The first priority determination value is a value L1×L2×L2, which is obtained by multiplying the value of the first shortest distance by the square value of the first projection distance. The first priority determination value decreases as the part is placed closer to the first screen center, for example, with decreasing first projection distance of the part. A higher display priority is set for a part placed closer to the first screen center, that is, a part with a lower priority determination value). In FIG. 24, the first priorities of the parts A and B are determined as "1" and "2", respectively.

In operation S52, a second priority determination value for determining the second priority for displaying each of the reproduction destination model parts is calculated based on the second shortest distance L1 and the second projection distance L2 of the reproduction source model part. Like the first priority determination value, the second priority determination value is set to a value of L1×L2×L2, which is obtained by multiplying the value of the second shortest distance by the square value of the second projection distance. The second priority determination value decreases as the part is placed closer to the second screen center, for example, with decreasing second projection distance of the part. A higher display priority is set for a part placed closer to the second screen center, for example, a part with a lower priority determination value.

For example, as illustrated in FIG. 25, if a priority determination value of 1573 is calculated as the priority determination value for the part A and a priority determination value of 175 is calculated as the priority determination value for the part B, the priority of the part B is set to be higher than the priority of the part A. In FIG. 25, the second priorities of the parts A and B are determined as "2" and "1", respectively, which are reversed from the priorities of the reproduction source model parts A and B illustrated in FIG. 24. FIG. 25 illustrates an example of the second priority determination values and the second priorities of the reproduction destination model parts.

As described above, when the first priority of the reproduction source model part and the second priority of the reproduction destination model part are determined for the same viewpoint, it is determined whether the first priority differs from the second priority (operation S53). If the first priority and the second priority are the same ("NO" path in operation S53), it is determined that the parts A and B each having a high priority have not been significantly changed between the reproduction source model and the reproduction destination model, and the processing proceeds to operation S7 illustrated in FIG. 12.

However, if the first priority differs from the second priority ("YES" path in operation S53), it is determined that a big change occurred in the parts A and B each having a high priority between the reproduction source model and the reproduction destination model. In this case, it is highly likely that the original states of the parts A and B (the visibility states of the reproduction source model parts) change and, thus, the part of interest (the portion of interest) is almost invisible. Therefore, to change the position of the viewpoint so that the part of interest is easily seen, a new viewpoint is selected from among a plurality (for example, four) viewpoint candidates (operations S54 to S56).

At this time, it is assumed that as illustrated in FIG. 26, offset (shifting) occurs between the points of measurement of the reproduction source model parts A and B (for example, the reproduction source point-of-measurement positions) and those of the reproduction destination model parts A and B (for example, the reproduction destination point-of-measurement positions), respectively. FIG. 26 illustrates an example of offset values between the reproduction source model part and the reproduction destination model part. In the example illustrated in FIG. 26, an offset of (2, 0, 0) occurs for the part A, and an offset of (−1, 0, 0) occurs for the part B with reference to the point of measurement in the reproduction source model. The top two priorities of the parts A and B in the reproduction source model are changed in the reproduction destination model. Accordingly, as illustrated in FIG. 27, the following four viewpoints are obtained as the viewpoint candidates: the viewpoint in the reproduction destination model (the original viewpoint), the offset viewpoint based on the part A, the offset viewpoint based on the part B, the viewpoint at the offset midpoint (the midpoint between the offset viewpoint based on the part A and the offset viewpoint based on the part B) (operation S54). FIG. 27 illustrates an example of the positions of the candidates for a new viewpoint.

The priority determination value (for example, a third priority determination value) and the priority in the case of adopting each of the viewpoint candidates are calculated and determined in the same manner as in FIG. 25 (operation S55). Thereafter, for each of the viewpoint candidates, the sum of the two priority determination values calculated for the top two parts A and B is calculated (1573+175=1748 in the example illustrated in FIG. 25). Among the four viewpoint candidates, the one having the smallest sum is selected as the new viewpoint (operation S56).

A single new viewpoint is selected from among a plurality of viewpoint candidates based on the sum of the priority determination values. However, the present disclosure is not limited to the scheme. A new viewpoint may be selected from among the viewpoint candidates based on the similarity between the feature amounts obtained by comparing the reproduction source image with the viewpoint candidate image as viewed from each of the viewpoint candidates, in addition to the sum of the priority determination values.

In this way, a viewpoint with a high priority or a viewpoint with a high similarity of the image feature amount is adopted as a new viewpoint for the portion of interest. In the three-dimensional assembly model whose design has progressed, the visibility state focused on the defective portion at the time of occurrence of a defect is reproduced and displayed on the output unit (the display unit) 40 with the viewpoint changed to the adopted new viewpoint (operation S7 in FIG. 12).

Figure 28:
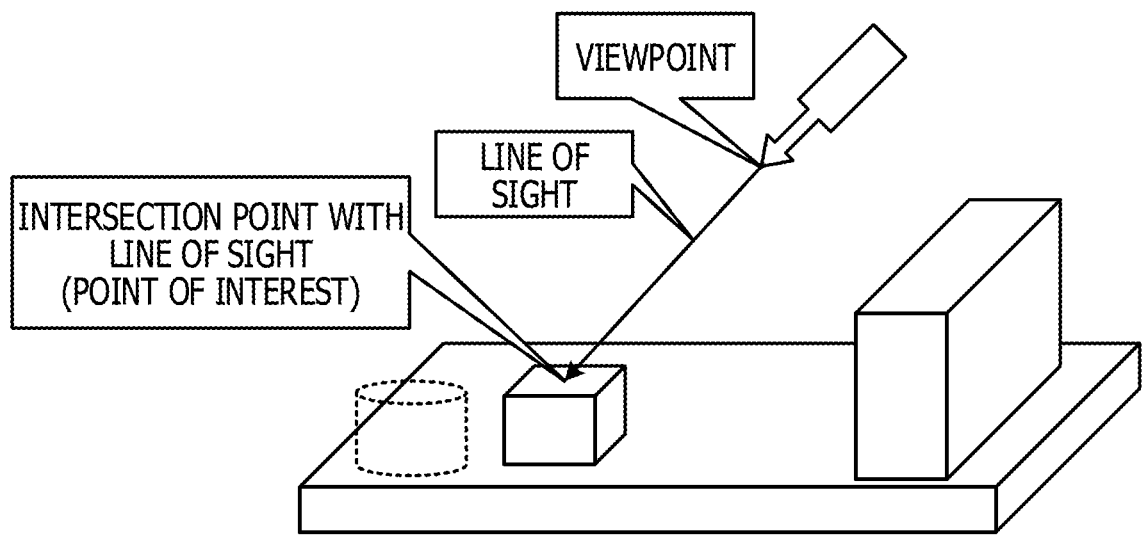
FIG. 28 illustrates an example of a viewpoint/line of sight/point of interest.

For example, as illustrated in FIG. 28, the visibility state of the three-dimensional assembly model is defined by, for example, the viewpoint position, the line-of-sight direction, and the point of interest in a space having the three-dimensional assembly model therein. The viewpoint position, the line-of-sight direction, and the point of interest are included in the field-of-view information 231 (refer to FIG. 10). The point of interest is the intersection point of the line of sight and the part. The point of interest may correspond to, for example, a defective point, a defective portion, a portion of interest, or a point of interest. FIG. 28 illustrates the viewpoint/line of sight/point of interest.

Figure 29:
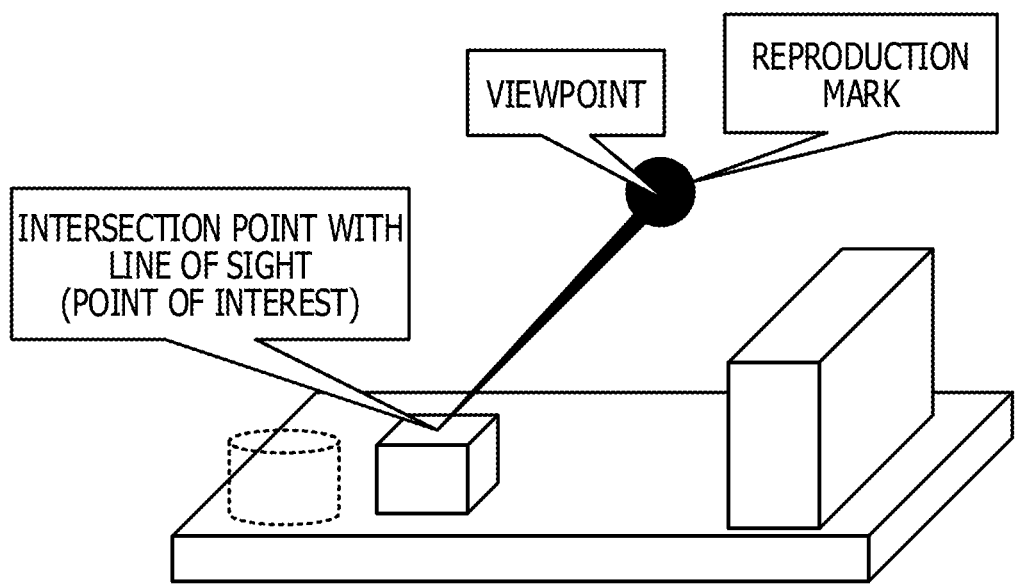
FIG. 29 illustrates an example of a displayed reproduction mark corresponding to the viewpoint/line of sight/point of interest illustrated in FIG. 28.

At this time, as illustrated in FIG. 29, the reproduction mark display unit 42 of the output unit 40 displays the field-of-view information 231 including the position of the viewpoint, the direction of the line of sight, the position of the point of interest as a reproduction mark which indicates the viewpoint, the line of sight, and the point of interest on the three-dimensional assembly model. FIG. 29 illustrates an example of a displayed reproduction mark corresponding to the viewpoint/line of sight/point of interest illustrated in FIG. 28.

Figure 30:
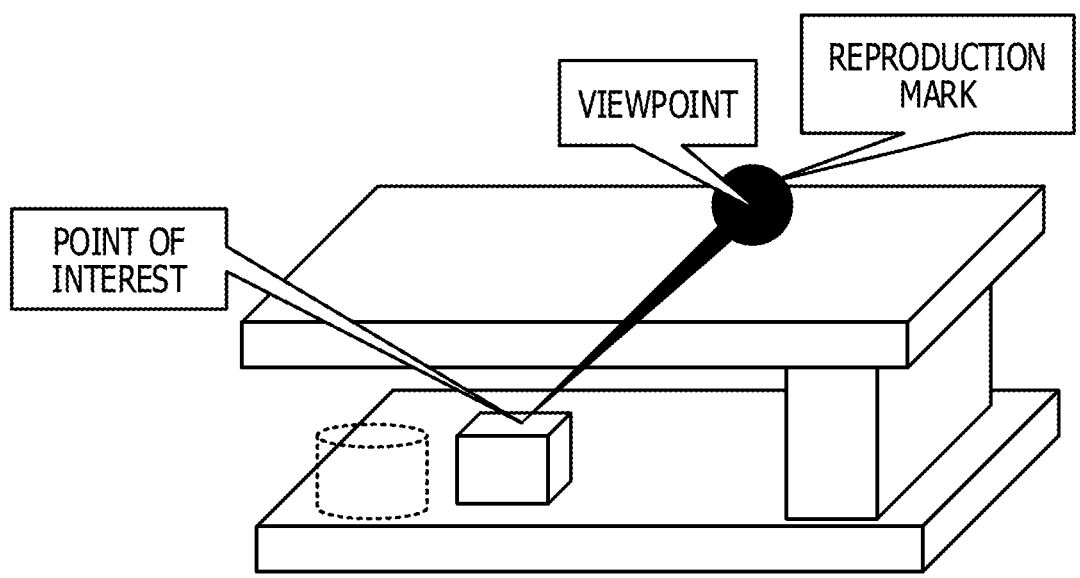
FIG. 30 illustrates an example of a fully visible state and an example of a displayed reproduction mark.

As illustrated in FIG. 30, when all of the parts of the three-dimensional assembly model are in a visible state (for example, a fully visible state), a point of interest (for example, a part of interest) is invisible from the viewpoint of the reproduction mark. Even in such a case, as illustrated in FIG. 30, the output unit 40 may display the reproduction mark such that the reproduction mark represents the line of sight from the viewpoint to the point of interest through a part in a visible state. FIG. 30 illustrates an example of the fully visible state and the displayed reproduction mark.

As illustrated in FIG. 31, when a three-dimensional assembly model and a reproduction mark are displayed and if a reproduction mark is hovered over with a cursor by, for example, the designer operating the input unit 10, the visibility state seen from the viewpoint and the line-of-sight direction corresponding to the reproduction mark (for example, a visibility state at the time of occurrence of a defect) is previewed. At this time, a preview screen (for example, a view image after switching of the viewpoint) may be displayed in the vicinity of the reproduction mark, or the view image and the model name of the portion of interest, for example, may be displayed. In such a visibility state, by performing an operation to select the reproduction mark by using a mouse or the like, the visibility state on the output unit 40 may be changed to the state seen from the viewpoint defined by the reproduction mark (the view image after the viewpoint switching in FIG. 31). FIG. 31 illustrates an example of the visibility state seen during the preview and the displayed reproduction mark.

If a displayed image from a certain viewpoint satisfies a predetermined condition (for example, the image has been displayed for a predetermined time period or longer) by the operation performed by, for example, the designer, the reproduction information recording unit 31 may automatically record the viewpoint reproduction information 23. An acquisition/recording operation of the viewpoint reproduction information 23 performed by the reproduction information recording unit 31 when the predetermined condition is satisfied is described below. At this time, the visibility state reproduction unit 32 reproduces and displays, on the output unit 40, the visibility state of the portion of interest seen from the viewpoint that the designer or the like frequently uses based on the viewpoint reproduction information 23 recorded in the storage unit 20.

As illustrated in FIG. 32, for example, when viewpoint movement or a visibility state change has not been performed for several seconds (the predetermined time period) after movement of the viewpoint, the viewpoint reproduction information 23 (refer to FIGS. 8 to 11) and the viewpoint image from the viewpoint are acquired and automatically recorded by the reproduction information recording unit 31 (operation S61).

At the time of automatic setting of the portion of interest, the portion-of-interest viewpoint grouping unit 36 groups the viewpoints each located physically close to the point of interest among the plurality of recorded viewpoints (operation S62).

By using a function the same as the function (12), for example, the functions serving as the new viewpoint reproduction unit 33 and the portion-of-interest viewpoint determination unit 34, one among the plurality of viewpoints in the same group (for example, a new viewpoint) is selected as a representative viewpoint (operations S63 and S64).

In operation S63, a plurality of viewpoints in the same group are considered as viewpoint candidates.

In operation S64, the priority determination value and the priority in the case of adopting each of the viewpoint candidates are calculated and determined in the same manner as in FIG. 25. Thereafter, for each of the viewpoint candidates, for example, the sum of the priority determination values calculated for the top two parts A and B is calculated. From among the plurality of viewpoint candidates, the one having the smallest sum is selected as a new viewpoint (for example, a representative point).

A reproduction mark is generated for the selected new viewpoint and is displayed on the output unit 40 (operation S65). If a plurality of reproduction marks are displayed in operation S65, a display method described below may be employed as illustrated in FIG. 34.

In this way, according to the viewpoint automatic recording function (13), the viewpoint that satisfies the predetermined condition and a change in its visibility state are recorded, and the representative point of the viewpoint frequently used is displayed on the output unit 40 in the form of a reproduction mark. By performing an operation on the reproduction mark displayed on the output unit 40, the designer or the like reproduces and displays, on the output unit 40, the visibility state of the portion of interest seen from the viewpoint that the designer or the like uses frequently.

As illustrated in FIG. 33, it is determined whether the viewpoint or the visibility state has changed within several seconds (for example, the predetermined time period) (operation S72) after the designer or the like moved the viewpoint or the visibility state changed (operation S71). If the viewpoint or the visibility state has changed within the predetermined time period ("YES" path in operation S72), the processing returns to operation S71, where the next movement of the viewpoint or a visibility state change is performed.

However, if the viewpoint or the visibility state has not changed within the predetermined time period ("NO" path in operation S72), the processes in operations S73 to S79 (for example, recording of the viewpoint) are performed based on the moved viewpoint. The processes in operations S73 to S79 illustrated in FIG. 33 may be the same as the processes in operations S13 to S19 illustrated in FIG. 13, respectively.

The display control may be applied when the mark display control unit 35 displays a plurality of reproduction marks in operation S65 illustrated in FIG. 32.

At this time, according to the display control, only the reproduction mark that is close to the line-of-sight direction from the current viewpoint position among the plurality of reproduction marks displayed in the reproduction mark display unit 42 (for example, the output unit 40) is displayed, as illustrated in FIG. 34.

Figure 35:
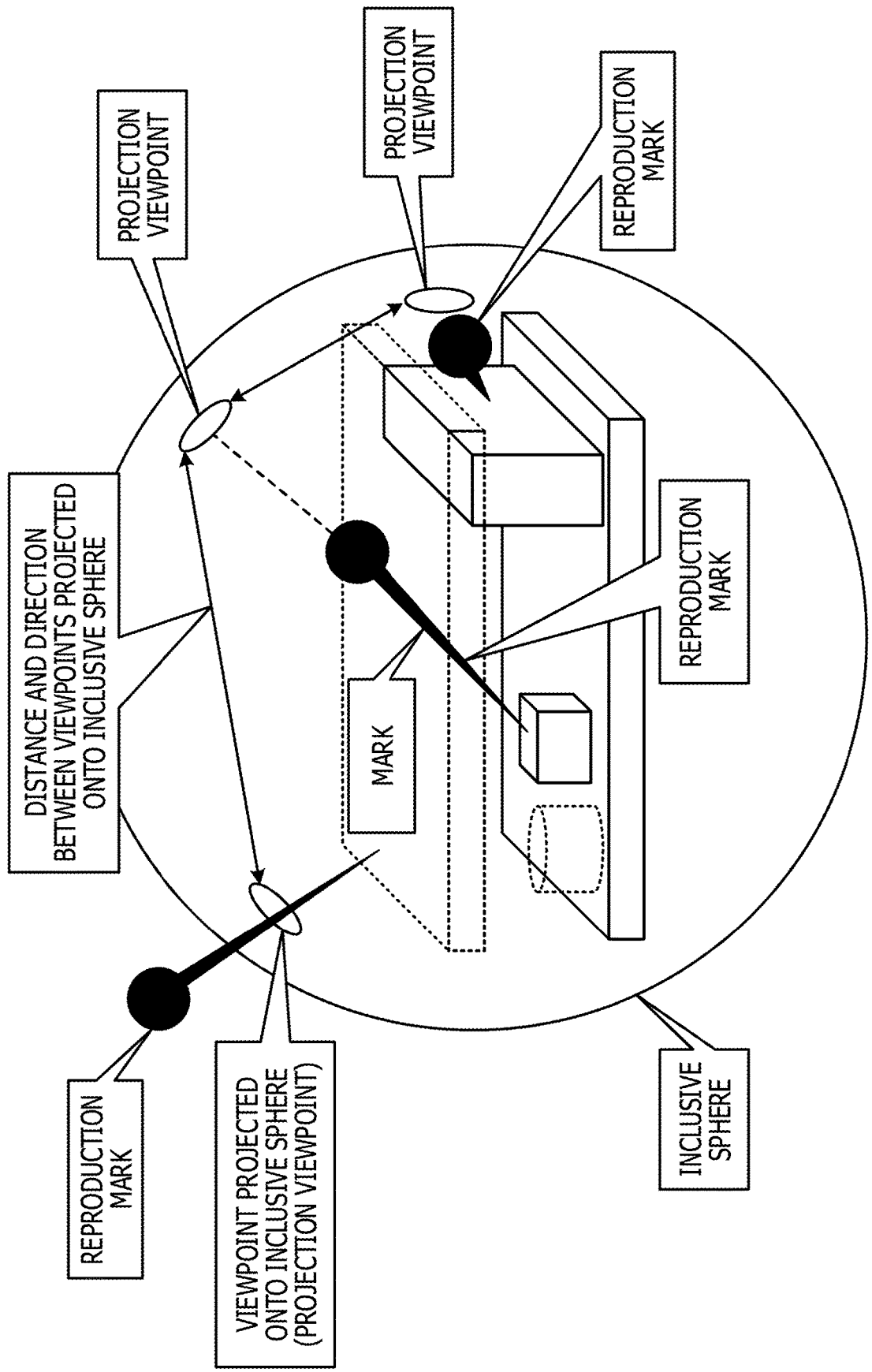
FIG. 35 illustrates an example of viewpoint movement in accordance with the distance between the viewpoints projected on the inclusive sphere.

As illustrated in FIG. 35, when a plurality of (for example, three) reproduction marks are dispersedly displayed at various positions, the viewpoint moving unit 37 projects the line-of-sight direction (for example, viewpoint) of the reproduction mark onto the inclusive sphere of the three-dimensional assembly model to normalize the line-of-sight direction. In response to an instruction from the input unit 10, such as an operation performed on an arrow key of a keyboard or a mouse scroll operation, the viewpoint moving unit 37 moves the viewpoint from the current viewpoint to the next viewpoint that is close in distance to the current viewpoint on the inclusive sphere (for example, a projection viewpoint).

For example, in response to an instruction from the input unit 10, from among the plurality of projection viewpoints projected on the inclusive sphere, the ones close in distance to the current projection viewpoint (for example, a reproduction mark corresponding to the projection viewpoint) are sequentially selected. In this manner, the viewpoint of the viewpoint image to be displayed is moved to the viewpoint represented by the selected reproduction mark, and the visibility state seen from the moved viewpoint is reproduced on the display unit 40. In this manner, viewpoint movement may be easily performed.

Movement of the viewpoint using the inclusive spheres described above is used by the designer or the like to easily select a registered viewpoint. By projecting a viewpoint onto the inclusive sphere and using the projected viewpoint, the viewpoint for seeing a nearby part and the viewpoint for seeing a distant part are selected by the projection viewpoints projected on the same inclusive sphere. For example, by weighing selection of the line-of-sight direction more heavily than selection of the viewpoint position, the viewpoint position for a displayed zoom-in image of the nearby part may be immediately and accurately moved to the viewpoint position for a displayed wide zoom-out range including a distant part and vice versa.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An information processing apparatus comprising:
   a processor; and
   a memory configured to store a design support program executed by the processor, the processor:
   calculates a first priority determination value for a first priority to display each of a plurality of parts at the first time point for each of the plurality of parts at a first time point during a design, based on a first shortest distance between a first viewpoint and the respective parts and based on a first projection distance between the respective parts and a first screen center of a first display screen that displays a state of the respective parts as viewed from the first viewpoint at the first time point;

calculates, for each of the parts at a second time point after the first time point, a second priority determination value for a second priority to display the respective parts at the second time point based on a second shortest distance between the first viewpoint and the respective parts and a second projection distance between a second screen center of a second display screen that displays a state of the respective parts as viewed from the first viewpoint at the second time point and the respective parts;

calculates, when the first priority based on the first priority determination value differs from the second priority based on the second priority determination value, a third priority determination value corresponding to the second priority determination value by replacing the first viewpoint with each of one or more viewpoint candidates other than the first viewpoint;

selects, as a new first viewpoint, a second viewpoint from among the first viewpoint and the one or more viewpoint candidates based on the third priority determination value; reproduces an image of the respective parts at the first time point as viewed from the new viewpoint; and displays the image on a display circuit, the first priority determination value is obtained by multiplying a value of the first shortest distance by a square value of the first projection distance, and the second priority determination value is obtained by multiplying a value of the second shortest distance by a square value of the second projection distance.

2. The information processing apparatus according to claim 1, wherein the processor:

calculates, for each of the parts at the first time point, the first priority determination value such that the first priority determination value decreases as the respective parts is closer to the first screen center and determines the first priority for the respective parts such that the first priority increases as the first priority determination value of the respective parts decreases; and calculates, for each of the parts at the second time point, the second priority determination value such that the second priority determination value decreases as the respective parts is closer to the second screen center and determines the second priority for the respective parts such that the second priority increases as the second priority determination value of the respective parts decreases.

3. The information processing apparatus according to claim 1, wherein the processor selects, as the new first viewpoint, the second viewpoint having the smallest sum value from among a sum of the second priority determination values of the respective parts calculated for the first viewpoint and sums of the third priority determination values of the respective parts calculated for each of the viewpoint candidates.

4. The information processing apparatus according to claim 1, wherein the first viewpoint is a viewpoint at the first time point at which a defect of a part occurs, and the one or more viewpoint candidates are one or more offset viewpoints obtained by moving the first viewpoint with reference to a position of each of the parts having the first priority and the second priority that differ from each other.

5. A design support method comprising:

calculating, by a computer, a first priority determination value for a first priority to display each of a plurality of parts at the first time point for each of the plurality of parts at a first time point during a design, based on a first shortest distance between a first viewpoint and the respective parts and based on a first projection distance between the respective parts and a first screen center of a first display screen that displays a state of the respective parts as viewed from the first viewpoint at the first time point;

calculating, for each of the parts at a second time point after the first time point, a second priority determination value for a second priority to display the respective parts at the second time point based on a second shortest distance between the first viewpoint and the respective parts and a second projection distance between a second screen center of a second display screen that displays a state of the respective parts as viewed from the first viewpoint at the second time point and the respective parts;

calculating, when the first priority based on the first priority determination value differs from the second priority based on the second priority determination value, a third priority determination value corresponding to the second priority determination value by replacing the first viewpoint with each of one or more viewpoint candidates other than the first viewpoint;

selecting, as a new first viewpoint, a second viewpoint from among the first viewpoint and the one or more viewpoint candidates based on the third priority determination value;

reproducing an image of the respective parts at the first time point as viewed from the new viewpoint; and displaying the image on a display circuit, the first priority determination value is obtained by multiplying a value of the first shortest distance by a square value of the first projection distance, and the second priority determination value is obtained by multiplying a value of the second shortest distance by a square value of the second projection distance.

6. The design support method according to claim 5, further comprising:

calculating, for each of the parts at the first time point, the first priority determination value such that the first priority determination value decreases as the respective parts is closer to the first screen center and determines the first priority for the respective parts such that the first priority increases as the first priority determination value of the respective parts decreases; and calculating, for each of the parts at the second time point, the second priority determination value such that the second priority determination value decreases as the respective parts is closer to the second screen center and determines the second priority for the respective parts such that the second priority increases as the second priority determination value of the respective parts decreases.

7. The design support method according to claim 5, the second viewpoint having the smallest sum value from among a sum of the second priority determination values of the respective parts calculated for the first viewpoint and sums of the third priority determination values of the respective parts calculated for each of the viewpoint candidates is calculated as the new first viewpoint.

8. The design support method according to claim 5, wherein the first viewpoint is a viewpoint at the first time point at which a defect of a part occurs, and the one or more viewpoint candidates are one or more offset viewpoints obtained by moving the first viewpoint with reference to a position of each of the parts having the first priority and the second priority that differ from each other.

9. A non-transitory computer-readable recording medium storing design support program which causes a computer to perform operations, the operations comprising:
calculating, by a computer, a first priority determination value for a first priority to display each of a plurality of parts at the first time point for each of the plurality of parts at a first time point during a design, based on a first shortest distance between a first viewpoint and the respective parts and based on a first projection distance between the respective parts and a first screen center of a first display screen that displays a state of the respective parts as viewed from the first viewpoint at the first time point;
calculating, for each of the parts at a second time point after the first time point, a second priority determination value for a second priority to display the respective parts at the second time point based on a second shortest distance between the first viewpoint and the respective parts and a second projection distance between a second screen center of a second display screen that displays a state of the respective parts as viewed from the first viewpoint at the second time point and the respective parts;
calculating, when the first priority based on the first priority determination value differs from the second priority based on the second priority determination value, a third priority determination value corresponding to the second priority determination value by replacing the first viewpoint with each of one or more viewpoint candidates other than the first viewpoint;
selecting, as a new first viewpoint, a second viewpoint from among the first viewpoint and the one or more viewpoint candidates based on the third priority determination value;
reproducing an image of the respective parts at the first time point as viewed from the new viewpoint; and
displaying the image on a display circuit, the first priority determination value is obtained by multiplying a value of the first shortest distance by a square value of the first projection distance, and the second priority determination value is obtained by multiplying a value of the second shortest distance by a square value of the second projection distance.

10. The non-transitory computer-readable recording medium according to claim 9, further comprising:
calculating, for each of the parts at the first time point, the first priority determination value such that the first priority determination value decreases as the respective parts is closer to the first screen center and determines the first priority for the respective parts such that the first priority increases as the first priority determination value of the respective parts decreases; and
calculating, for each of the parts at the second time point, the second priority determination value such that the second priority determination value decreases as the respective parts is closer to the second screen center and determines the second priority for the respective parts such that the second priority increases as the second priority determination value of the respective parts decreases.

11. The non-transitory computer-readable recording medium according to claim 9, the second viewpoint having the smallest sum value from among a sum of the second priority determination values of the respective parts calculated for the first viewpoint and sums of the third priority determination values of the respective parts calculated for each of the viewpoint candidates is calculated as the new first viewpoint.

12. The non-transitory computer-readable recording medium according to claim 9, wherein the first viewpoint is a viewpoint at the first time point at which a defect of a part occurs, and the one or more viewpoint candidates are one or more offset viewpoints obtained by moving the first viewpoint with reference to a position of each of the parts having the first priority and the second priority that differ from each other.

* * * * *